United States Patent [19]

Limpaecher

[11] Patent Number: 5,905,371

[45] Date of Patent: May 18, 1999

[54] SEQUENTIAL DISCHARGE AND ITS USE FOR RECTIFICATION

[75] Inventor: Rudolf Limpaecher, Topsfield, Mass.

[73] Assignee: D.C. Transformation, Inc., Beverly, Mass.

[21] Appl. No.: 08/494,236

[22] Filed: Jun. 23, 1995

[51] Int. Cl.[6] ............................................ G05F 1/40
[52] U.S. Cl. ........................ 323/288; 320/166; 363/140; 307/110
[58] Field of Search .............................. 363/140, 59, 60; 323/288, 290; 320/166, 118; 307/110

[56] References Cited

U.S. PATENT DOCUMENTS

| | | | |
|---|---|---|---|
| 3,366,799 | 1/1968 | Fitch | 307/110 |
| 3,505,586 | 4/1970 | Dulin | 363/62 |
| 3,663,940 | 5/1972 | Schwarz | 363/28 |
| 3,678,362 | 7/1972 | Amberger et al. | 320/166 |
| 3,743,914 | 7/1973 | Holz | 320/1 |
| 3,805,143 | 4/1974 | Tauern et al. | 363/88 |
| 3,808,512 | 4/1974 | Sakka | 363/62 |
| 3,839,666 | 10/1974 | Kitaev | 363/138 |
| 3,849,717 | 11/1974 | Walz et al. | 363/61 |
| 3,878,449 | 4/1975 | Wilhelmi et al. | 307/108 |
| 4,079,265 | 3/1978 | Woodburn | 307/108 |
| 4,274,134 | 6/1981 | Johannessen | 363/59 |
| 4,460,953 | 7/1984 | Fukushima et al. | 363/62 |
| 4,523,269 | 6/1985 | Baker et al. | 363/138 |
| 4,524,289 | 6/1985 | Hammond et al. | 307/110 |
| 4,636,930 | 1/1987 | Bingham et al. | 363/60 |
| 4,642,476 | 2/1987 | Honig | 307/108 |
| 4,649,468 | 3/1987 | Cubbison | 363/62 |
| 4,675,795 | 6/1987 | Takamura et al. | 363/61 |
| 4,797,899 | 1/1989 | Fuller et al. | 363/60 |
| 4,807,104 | 2/1989 | Floyd et al. | 363/59 |
| 4,812,961 | 3/1989 | Essaff et al. | 363/61 |
| 4,882,665 | 11/1989 | Choi et al. | 363/60 |
| 5,119,010 | 6/1992 | Shirata et al. | 320/15 |
| 5,270,913 | 12/1993 | Limpaecher | 363/140 |
| 5,345,376 | 9/1994 | Nourbakhsh | 363/62 |
| 5,357,419 | 10/1994 | Limpaecher | 363/140 |
| 5,473,526 | 12/1995 | Svensson et al. | 363/60 |
| 5,608,614 | 3/1997 | Ohnishi et al. | 363/60 |

FOREIGN PATENT DOCUMENTS

| | | |
|---|---|---|
| A-20 52 382 | 4/1972 | Germany . |
| 1087933 | 10/1961 | United Kingdom . |
| 975911 | 5/1962 | United Kingdom . |
| 988777 | 1/1963 | United Kingdom . |
| 988778 | 1/1963 | United Kingdom . |
| 1161250 | 12/1966 | United Kingdom . |
| 1161347 | 10/1967 | United Kingdom . |
| A-2 104 737 | 3/1983 | United Kingdom . |

OTHER PUBLICATIONS

Crouch et al., "A Compact High Speed Low Impedance Blumlein Line for High Voltage Pulse Shaping", The Review of Scientific Instruments, vol. 43, No. 4, Apr. 1972, pp. 632–637.

Kuffel et al., "High–Voltage Engineering", Applied Electricity and Electronics, Pergamon Press, 1984, pp. 12–23, 64–79.

Von Bergmann, "Photo–Preionization Stabilized High–Pressure Glow–Discharge Lasers", University of Natal, 1980, Ph.D. Thesis, pp. 90–99, 176–178. (Univ. Kiel). Dept of Physics.

(List continued on next page.)

*Primary Examiner*—Shawn Riley
*Attorney, Agent, or Firm*—Fish & Richardson P.C.

[57] ABSTRACT

A method of transferring energy from a power source into an output node including the steps of separately charging each of a plurality of energy storage elements from the power source; after the plurality of energy storage elements are charged, discharging a selected one of the energy storage elements through an inductive element into the output node; and as the selected energy storage element is being discharged through the inductive element, when its voltage reaches a preselected value, discharging another one of the energy storage elements through the inductive element into the output node.

26 Claims, 14 Drawing Sheets

OTHER PUBLICATIONS

Skeist et al., "Recent Advances in High Power, High Voltage Technology", The Power Sources Conference, S10/1–1:1–11 1984. Spellman High Voltage Electronics Corp., Plainview, New York.

Malesani et al., "Active Power Filter with Hybrid Energy Storage", IEEE, vol. 6, No. 3, Jul. 1991, pp. 392–397.

Bellar et al., "Analysis of the Dynamic and Steady–State Performance of Cockcroft–Walton Cascade Rectifiers", IEEE, vol. 7, No. 3, Jul. 1992, pp. 526–534.

Joos et al., "Performance Analysis of a PWM Inverter VAR Compensator", IEEE, vol. 6, No. 3, Jul. 1991, pp. 380–391.

Klaassens et al., "Three–Phase AC–to–AC Series–Resonant Power Converter with a Reduced Number of Thyristors" IEEE, vol. 6, No. 3, Jul. 1991, pp. 346–355.

Wernekinck et al., "A High Frequency AC/DC Converter with Unity Power Factor and Minimum Harmonic Distortion", IEEE, vol. 6, No. 3, Jul. 1991, pp. 364–370.

Redl et al., "A Novel Soft–Switching Full–Bridge DC/DC Converter: Analysis, Design Considerations, and Experimental Results at 1.5 kW, 100 kHz", IEEE, vol. 6, No. 3, Jul. 1991, pp. 408–418.

Fitch et al., "Novel Principle of Transient High Voltage Generation," Proceedings, vol. 111, Apr. 1964, pp. 849–855.

Fitch, "Marx—and Marx Like—High Voltage Generators," Maxwell Laboratories, Inc., pp. 190–198 (1970).

SEQUENTIAL DISCHARGE AND ITS USE FOR RECTIFICATION

BACKGROUND OF THE INVENTION

The invention relates to AC to DC power conversion and/or rectification.

Standard rectification using diode brides causes both harmonics and a reactive power on the AC line. This is because power is drawn from the line when its AC voltage is higher than the output voltage and no power is drawn from the line when its AC voltage is lower than the output voltage. This uneven loading of the line throughout the AC cycle introduces harmonics onto the line. Current is only drawn out of the system when the voltage is high relative to the output voltage. As a consequence, conventional bridge or half wave rectification techniques seriously distort the input waveform. This problem is solved by using harmonic filters and capacitors to eliminate the harmonics. In addition, filtering is added on the DC side to reduce ripple that the processes tends to cause.

In an earlier patent (i.e., U.S. Pat. No. 5,270,913 filed Apr. 6, 1992, and incorporated herein by reference), I described a transformerless power conversion system (referred to hereinafter as PCS). In very general terms, the PCS works by charging a set of capacitors from a power source, possibly transforming the voltage across the set of capacitors by inverting the voltages on selected capacitors, and then discharging the set of capacitors at the transformed voltage into a distribution node or load. In other words, a complete cycle of operation in the PCS includes a charging phase, possibly an inversion phase, and a discharging phase. By employing many cycles of operation per second (e.g. 1 to 2 kHz), the PCS can extract charge from the power source and inject it into the distribution node or load to reconstruct an output having a desired waveform. The PCS is extremely versatile in the transformations which it can be configured to perform. For example, it can be configured to convert AC to DC, DC to DC with step-up or step-down, DC to AC, or AC of one frequency to AC of another frequency, to name a few.

In the case of AC to DC conversion, charging the PCS from a low voltage source (e.g. when the instantaneous voltage of the input AC waveform is low) presents the same type of problem that is encountered with conventional rectification. If the transformed voltage in the PCS is less than at least two times the output voltage, it will not be possible to fully discharge the capacitors into the DC output terminal. Therefore, it follows that the PCS system can also impose a nonuniform load on the input line and thereby distort the input waveform by introducing harmonics back onto the input line.

As described in the earlier patent, however, this problem can be solved by using multiple charging cycles per discharge cycle. In this way, the output voltage of the PCS can be made sufficiently high to permit a complete discharge of the storage capacitors during the discharge cycle. Though that technique works, it may be more complex than necessary, it involves more computation, and it requires capacitors with higher voltage ratings.

SUMMARY OF THE INVENTION

In general, in one aspect, the invention is a method of transferring energy from a power source into an output node. The method includes separately charging each of a plurality of energy storage elements from the power source; after the plurality of energy storage elements are charged, discharging a selected one of the plurality of energy storage elements through an inductive element into the output node; and as the selected energy storage element is being discharged through the inductive element, when its voltage reaches a preselected value, discharging another one of the energy storage elements through the inductive element into the output node.

In preferred embodiments, during the charging step each of the energy storage elements is charged to a corresponding voltage, and the method further includes selecting as the selected energy storage element the one with the largest voltage. The output node is at an output voltage and the voltage of the selected energy storage element is at least two times the output voltage. A complete cycle of operation includes the above described charging steps followed by the above-described discharging steps, and the method further includes causing a complete cycle of operation to occur multiple times per second. The method also includes after the energy storage elements are charged and before discharging a selected one of the energy storage elements, inverting the polarity of charge stored in at least some of the energy storage elements.

In general, in another aspect, the invention is a sequential discharge circuit for transferring energy from a power source into an output node. The circuit includes a plurality of energy storage elements connected to receive energy from the power source; a shared inductive element connected between the plurality of energy storage elements and the output node; a plurality of unidirectional switches, each of which when turned on discharges a corresponding different one of the storage elements through the shared inductive element into the output node; and a control unit connected to control terminals of the unidirectional switches and controlling the operation of the plurality of unidirectional switches.

In preferred embodiments, the plurality of energy storage elements includes a first energy storage element and a second energy storage element; the plurality of unidirectional switches includes a first unidirectional switch connected to the first energy storage element and a second unidirectional switch connected to the second energy storage element; and the control unit is programmed to perform the certain steps. In particular, the control unit is programmed to charge the first energy storage element from the power source; charge a second energy storage element from the power source; after the first and second energy storage elements are charged, discharge a selected one of the first and second the energy storage elements through the shared inductive element into the output node; and as the selected energy storage element is being discharged through the inductive element, when its voltage reaches a preselected value, discharge the other one the first and second energy storage elements through the inductive element into the output node.

In preferred embodiments the inductive element is an inductor.

In general, in yet another aspect, the invention is a sequential discharge circuit for transferring energy from a power source into an output node. The circuit includes a transformer with a primary and a secondary; a plurality of energy storage elements connected to receive energy from the power source; a plurality of unidirectional switches, each of which when turned on discharges a corresponding different one of the plurality of storage elements through the primary of the transformer; and a control unit connected to control terminals of the plurality of unidirectional switches and controlling the operation of the plurality of unidirectional switches.

Preferred embodiments include the following features. The sequential discharge circuit further includes a shared inductive element connected between the secondary and the output node; or alternatively, a shared inductive element connected between the primary and the plurality of unidirectional switches.

In still another aspect, the invention is a power conversion system for extracting energy from a power source and delivering it to an output node. The system includes a transformer having a primary winding and a secondary winding; a unidirectional switching device coupled between the power source and the primary winding of the transformer; a plurality of capacitors connected in series; a charging circuit connected to the plurality of capacitors and charging the plurality of capacitors from the secondary winding of the transformer to a predetermined voltage; a polarity inverting circuit inverting the polarity of the charge stored in selected capacitors of the plurality of capacitors, which polarity inverting circuit includes a plurality of inductor circuits, each of which can be switchably coupled to a corresponding different one of the selected capacitors to form a resonant circuit which aids in inverting the polarity of a stored charge in that capacitor; and a discharging circuit extracting power from the plurality of capacitors at a transformed voltage.

In preferred embodiments, the transformer is, for example, a step-up transformer, or an isolation transformer.

In yet another aspect, the invention is a power conversion system for extracting energy from a power source and delivering it at a transformed voltage to an output node. In this case, the system includes a transformer having a primary winding and a secondary winding, which is coupled to the output node.

In preferred embodiments, the power conversion system also includes a unidirectional device coupling the secondary winding to the output node. Also, the transformer is, for example, a step-down transformer or an isolation transformer.

One very attractive application of the sequential discharge technique is for a harmonic-free conversion of multi-phase AC power to DC and in AC to AC waveform reconstruction. By charging a capacitor, the sequential discharge technique allows the energy extraction from any phase of a multi-phase AC line to be proportional to the square of the momentary line voltage. Performing the charging at constant intervals loads the AC line to the desired power level at any part of the AC cycle. This enables one to load the multi-phase AC line uniformly and maintain a balanced and constant power. Since the load which the rectification technique imposes on the multiple phase inputs is equivalent to a resistive load, it produces no harmonic distortions that must be filtered out. Thus, the sequential discharge technique substantially eliminates the generation of harmonics. Though the rectification approach of the invention includes about the same number of components as a conventional bridge rectification approach, it completely eliminates the need for expensive, harmonic filters on the input side of the system. Thus, the invention permits the elimination of harmonic filters, VAR capacitor banks, and DC ripple filters. In addition, the load current is in phase with the AC voltage, yielding a unity power factor. This eliminates the requirement for phase angle correction.

The invention is particularly well suited for application to multiphase AC input but it may be also may be used for other specialized operations. For example, the same technique can also be used in a more effective AC to AC asynchronous power conversion system and other applications.

The invention may also be used in conjunction with a PCS yielding transformation and rectification for either voltage step-up or step-down. The invention significantly simplifies control and operation of the PCS system and permits a larger power throughput. When used in connection with the PCS, the PCS does not store any significant amount of energy in the conversion process. Therefore, as a consequence of the constant power throughput, the DC output is ripple-free, which also saves on filtering on the DC side. Full and continued regulation is obtained for both applications. This rectification system is relatively simple and could be used for many industrial applications.

An attractive application of the invention would be to rectify and step-up the power from an AC source and feed it directly into a two-line (plus and minus) DC overland transmission line. For existing converters, it is necessary to install filters to reduce harmonics on the AC side and a ripple filter on the DC side. Such filters are of considerable size and form an appreciable part of the power generation costs. The problem comes from the fact that standard rectification techniques load the AC lines disproportionately at the higher voltage part of the AC cycle.

The potential uses of the invention in the industrial world are manifold. Efficient and harmonic-free rectification is required for many applications. For the purposes of DC transmission, AC rectification has to be performed on a large scale and high voltage level. Approximately 12% of US power is consumed for the production of aluminum. In addition, industry uses electrowinning and electrolytic refining processing for the production of sodium, magnesium, copper, silver, lead, nickel, zinc, chlorine, fluorine and hydrogen. And this is not a complete list.

The rectification of AC power is also required for most motor drives, where AC is rectified to DC and then the DC is converted back to AC having the desired frequency. An additional application is in Uninterruptible Power Supplies (UPS) where the AC input is typically rectified and converted back to AC. Using the invention, energy can be extracted from the grid without distorting the voltage on the grid. Moreover, the extracted energy can then be used to generate a new AC waveform at the desired frequency using the transformation techniques that were described in U.S. Pat. No. 5,270,913 or using other standard DC conversion techniques. This technique is also very useful for variable speed motor control.

In addition, a rectification steps are required in many other areas. For example, rectification is used in the front end of UPS (uninterruptible Power Supplies) and other temporary battery power storage. Moreover, once the electric car gets on the road, these vehicles will need to be charged during the night from an AC grid. To that, add the potential of inductive energy storage, where electric energy is stored in large magnetic coils to be used during peak consumption or short power interruption.

There has been a significant increase in nonlinear loads that are being attached to the grid. This increase has prompted an increased concern about harmonics. Harmonic current flow in the power system as reactive power (VAR), adds to the increased apparent power demand of nonlinear loads. The harmonic current causes additional heat and stress on the power system components due to their higher frequency. For some components, such as transformers, the derating for harmonic currents can be substantial (e.g. 30% to 40%).

Industry standards are being formulated to limit harmonics in the power system and to encourage the development of electrical loads that do not generate harmonics. Two such standards are IEC 555 and IEEE 519. IEC 555 limits the levels of harmonic current generated from individual load equipment connected to public power systems in Europe. In the US, IEEE 519 has been revived to establish recommended limits on the level of harmonics that users can inject into the public power system. The use of the three phase rectification system which embodies the invention would eliminate harmonics generation in the rectification system.

Other advantages and features will become apparent from the following description of the preferred embodiment and from the claims.

DESCRIPTION OF THE PREFERRED EMBODIMENTS

Figure 1:
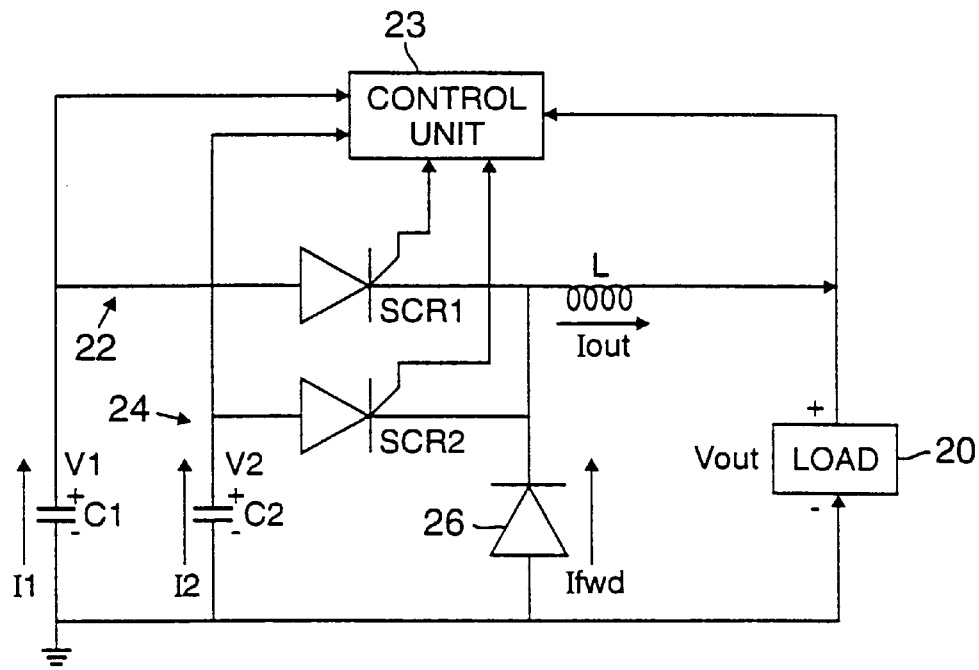
FIG. 1 is a circuit which is used to illustrate the sequential discharge technique.

Overview of the Sequential Discharge Technique:

To illustrate the invention and to make some representative numerical computations, we will use the sequential discharge circuit 10 shown in FIG. 1. Circuit 10 includes two capacitors, $C_1$ and $C_2$, from which power will be extracted into a load 20 to produce an output voltage, $V_{out}$. It should be understood that there is an implied charging system in front of the capacitors. For example, the capacitors might be the capacitors of a PCS module that is configured to provide DC step-up or step-down module, such as is described in U.S. Pat. No. 5,270,913. Or the capacitors might be the output capacitors of a simple LC charging stage, an example of which will be presented later (see FIG. 7). In general, the capacitors are first charged during a charging cycle to some predetermined level and then they are sequentially discharged into load 20 during a discharge cycle.

Circuit 10 includes two discharge paths 22 and 24, one connected to capacitor $C_1$ and the other connected to capacitor $C_2$. The first discharge path includes a silicon controlled rectifier, $SCR_1$, that is connected through inductor L to load 20. The second discharge path includes a second silicon controlled rectifier, $SCR_2$, that is also connected through the same inductor L to load 20. $SCR_1$ and $SCR_2$ are arranged so that when they are triggered on they discharge their respective capacitors through inductor L. A free wheeling diode 26 is connected between ground and the side of inductor L to which $SCR_1$ and $SCR_2$ are connected. Free wheeling diode prevents the voltage on either of the capacitors to reversing at the end of a complete discharge. A programmable control unit 23 (e.g. a computer or general data processing unit) samples the voltages across the capacitors $V_1$ and $V_2$, samples the output voltage $V_{out}$, and triggers the SCR's at the appropriate times.

In general, discharge circuit 10 discharges capacitors $C_1$ and $C_2$ in sequence and through the shared output inductor L. In addition, for every charge cycle, there is a discharge cycle in which both capacitors are typically discharged. The capacitor with the highest voltage is discharged first, followed by the discharge of the capacitor with the lower voltage. If properly timed, the excess energy from the high voltage input module helps to pull out the energy from the low voltage input module. This method enables input charging to occur at constant intervals and thus it reduces the computational requirements.

As an aside, it should be understood that the term "load" when used herein, is meant to have a very general meaning unless indicated otherwise by the specification or the context in which it is being used. It includes a node, a power distribution point, a motor, a simple resistive load, the input of a circuit to which power is being supplied, etc. In addition, though we have referred to SCR's in this and subsequent embodiments, any of a wide variety of switching devices can be substituted for the SCR, depending upon the requirements of the particular application, including, for example, thyristors, Crossatrons, GTO's, any semiconductor unidirectional switching devices, etc.

The following discussion presents the details of a discharging cycle that immediately follows a charging cycle during which capacitors $C_1$ and $C_2$ are charged to initial voltages of $V_{O1}$ and $V_{O2}$, respectively. For the following discussion, we assume the output voltage to be $V_{out}=10$ kV and an initial voltage condition of $V_{O1}>V_{O2}$.

Two different sequential discharge modes of operation will be described. In both modes of operation, it is assumed that the voltage $V_{O1}$ is greater than or equal to twice the output voltage $V_{out}$ and $SCR_1$ is triggered first to discharge $C_1$ and then $SCR_2$ is triggered to discharge $C_2$. The requirement that $V_{01} \geq V_{out}$ is necessary in order to assure that $C_1$ will completely discharge during its discharge cycle. In the following example, we select $V_{01}=25$ kV which meets this requirement. The difference between the two modes is in the timing of the triggering of $SCR_2$. In the first mode, $SCR_2$ is triggered when $V_1$ reaches zero volts. In the second mode, $SCR_2$ is triggered when $V_1$ reaches the value of $V_{02}$.

When $SCR_1$ is triggered, capacitor $C_1$ discharges through inductor L into output load 20. At the end of discharge (i.e., when $V_1$ equal zero), free wheeling diode 26 prevents the voltage on $C_1$ from reversing and it permits the energy remaining in the inductor L to be transferred to output load 20. At the point that $V_1$ reaches zero, the current in the inductor is given by:

$$I_O = \frac{\left((V_{01}^2 - 2 \times V_{01} \times V_{out})\right)^{1/2}}{(L/C_1)^{1/2}}$$

and at that point the energy stored in the inductor L is:

$$E_L = \frac{1}{2} \times C_1 \times (V_{01}^2 - 2 \times V_{01} \times V_{out})$$

If we trigger $SCR_2$ when $V_1$ reaches 0 and connect capacitor $C_2$ through inductor L to output load 20, the current in the inductor, $I_{out}$, represents an initial condition for the discharge of the second capacitor $C_2$. Thus, there will be a certain range of voltages $V_2 < 2 V_{out}$ for which it will be possible to fully discharge the capacitor $C_2$. If $V_{02} \geq 2 V_{out}$, then sequential discharge is not required, since the voltage on $C_2$ is sufficiently large to enable the capacitor to completely discharge by itself. However, sequential discharging may still be used in this case in order to combine the effect of the excess voltage of $C_1$ and $C_2$ to aid in discharging additional capacitors that have lower voltage levels.

The range of voltages less than $2 V_{out}$ for which this is true can be solved either analytically, graphically, or with the use of circuit modeling codes. If we plot the voltage and current for a discharge with a capacitor voltage equal to twice that of the output voltage, both the voltage and current will be zero at the end of the discharge. If we look at the curve, we will find that for any current that is less than the maximum current of:

$$I_{max} = V_{out} \times \left(\frac{C_1}{L}\right)^{\frac{1}{2}}$$

the capacitor voltage $V_2$ has two solutions. The two solutions correspond to the initial voltages that capacitor $C_2$ must have in order to fully discharge all of the energy from capacitor $C_2$. If the initial voltage of $C_2$ is between those two solutions, the capacitor cannot be completely discharged. If current remains in inductor L when $V_2$ reaches zero, an additional capacitor, such as the input from a third phase, can then be discharged.

As should be readily apparent, the energy and voltage in each capacitor varies throughout the 60 Hz cycle if the capacitors are charged from the AC grid. However, what may not be so apparent is that the total energy of all of the capacitors is constant and that this is true for any number of capacitors charged from a multi-phase power source with any number of phases larger than one. This fact has a very important implication. It does not matter when in the 60 Hz cycle the discharge is begun since the total energy in all of the capacitors remains constant throughout the cycle. Thus, there will be a constant power flow through the circuit so long as the capacitors are completely discharged and they are originally charged at constant time intervals.

Figure 2:
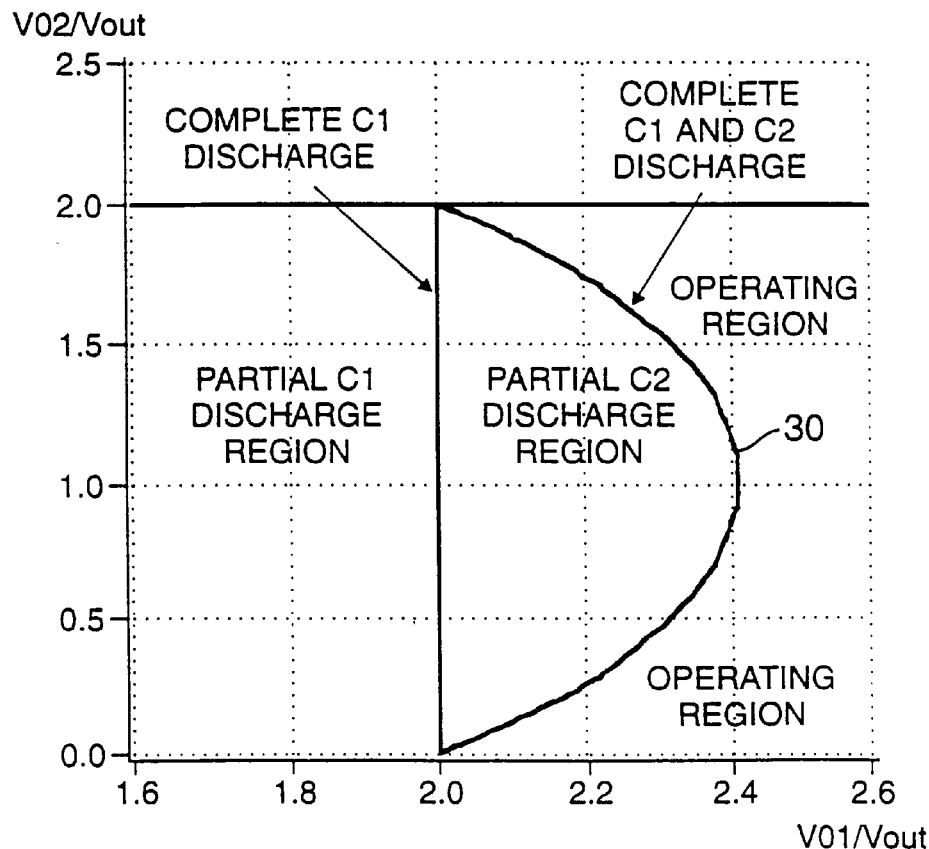
FIG. 2 is a plot of the various operating regions of the circuit of FIG. 1.

The complete discharge of $C_1$ and $C_2$ is possible only if their initial conditions are properly selected. $V_{01}$ must be at least $2 V_{out}$ to enable it to fully discharge into a node that is at $V_{out}$. Even if $V_{01}$ is above $2 V_{out}$, if it is not sufficiently above $2 V_{out}$, the residual current that remains in inductor L when $V_1$ reaches zero may not be sufficient to cause the complete discharge of $C_2$ into the node at $V_{out}$. FIG. 2 presents a plot of the different operating regions of the circuit shown in FIG. 1. The x-axis represents the ratio of the initial voltage across $C_1$ to the output voltage (i.e., $V_{10}/V_{out}$); and the y-axis represents the ratio of the initial voltage across $C_2$ to the output voltage (i.e., $V_{02}/V_{out}$).

If the initial voltages on capacitors $C_1$ and $C_2$ are properly selected, both capacitors can be fully discharged at the end of a sequential discharge cycle, with no residual current remaining in inductor L. The set of conditions which produce such a result are shown by curve 30. The equation for curve 30 is as follows:

$$V_{02} = V_{out} \pm (V_{out}^2 - V_{01}^2 + 2 \times V_{out} \times V_{01})^{1/2}$$

The condition can be put in a simpler form:

$$E_1 + E_2 = 2 \times (E_1^{1/2} + E_2^{1/2})$$

where $E_m$ is the ratio of the initial energy stored in capacitor $C_m$ divided by the energy remaining when its voltage equals the output voltage, $V_{out}$. If the condition is such that the left side of the equation is smaller than the right side, then the initial condition falls to the left of the curve in the FIG. 2 and the second capacitor cannot be discharged.

If the initial conditions fall within the region to the left of curve 30 but to the right of $V_{01}/V_{out}=2.0$, then it will be possible to fully discharge capacitor $C_1$ but not capacitor $C_2$. In the region to the left of the line $V_{01}/V_{out}=2.0$, it will not be possible to fully discharge either $C_1$ or $C_2$.

If initial conditions fall within the region to the right of curve 30, then both capacitors can be fully discharged through sequential discharging with some residual current remaining in inductor L. As noted above, the residual current in inductor L can supply the initial condition for discharging a third capacitor (not shown), where the combined condition of the first two capacitors, if appropriately selected, will permit the full discharge of the third capacitor. Following the above reasoning, it should be apparent that the solution for $V_{03}$ (i.e., the voltage(s) at which full discharge is possible) will have four roots or, once the voltage for the first two capacitors is specified, two roots. This process can be continued as long as a residual inductor current remains on subsequent discharges. The discharge sequence is best performed with the discharge of capacitors in the order of decreasing voltages.

Figure 3A:
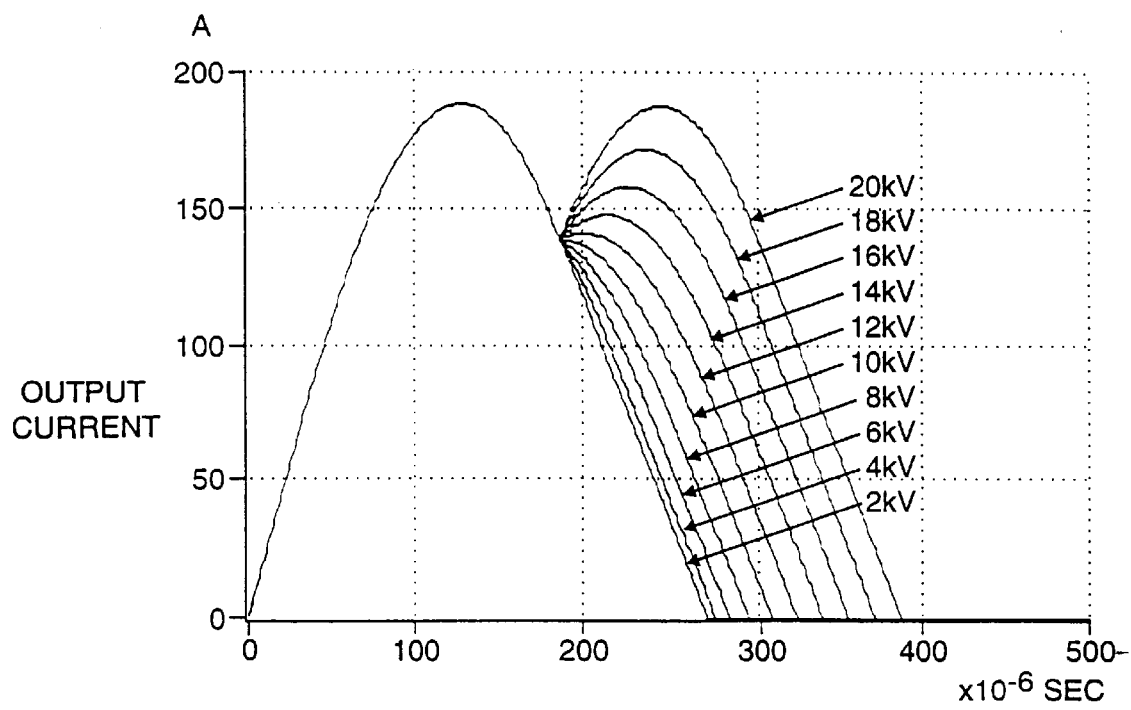
FIG. 3A shows plots of the output current, $I_{out}$, of the circuit of FIG. 1 as a function of time for different values of $V_{O2}$ (for first operating mode)
Figure 3B:
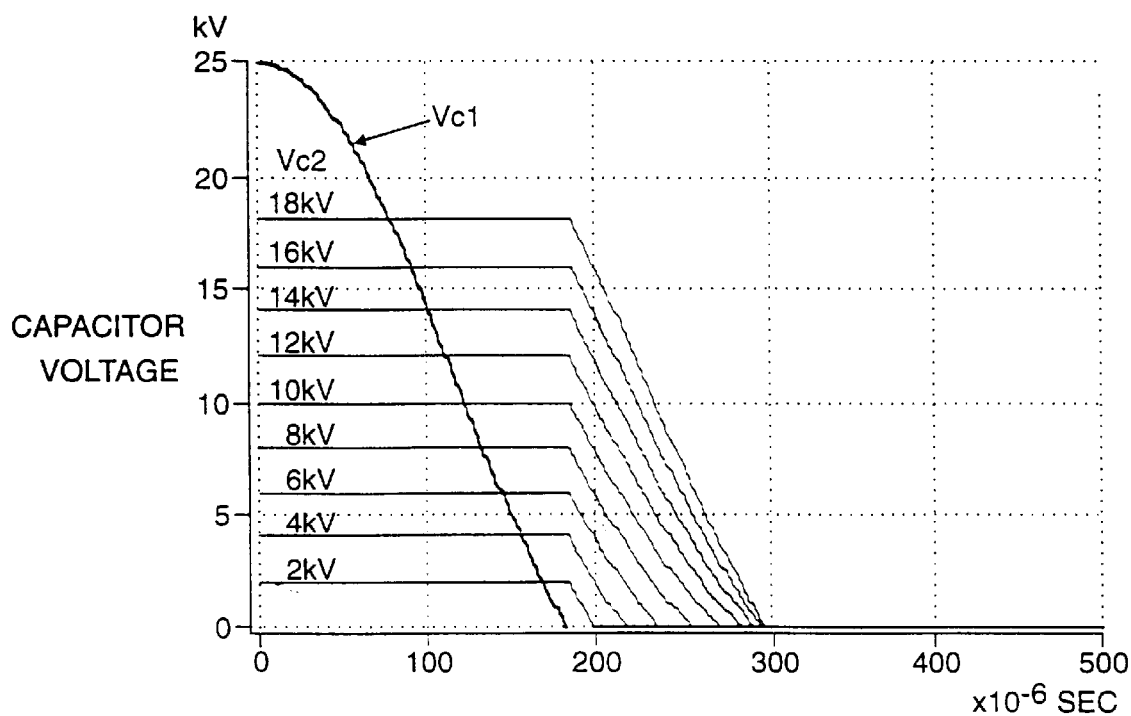
FIG. 3B shows plots of the capacitor voltages, $V_1$ and $V_2$, as a function of time for different values of $V_{O2}$ (for first operating mode)

FIGS. 3A and 3B show simulated output current and voltage waveforms, respectively, for one complete discharge cycle of operation of the above-described sequential discharge technique. In this example, $SCR_1$ is triggered first and when $V_1$ reaches zero volts, $SCR_2$ is triggered. The initial voltage $V_{01}$ was selected to be 25 kV and $V_{02}$ is some smaller value, as indicated on the curves. By selecting $V_{01}$ to be 2.5 times the output voltage $V_{out}$, this permits the full discharge of $C_2$ over the complete range of initial voltages that $C_2$ might have. If the voltage $V_1$ is between 25 kV and 20 kV, the voltage range for $V_{02}$ which will allow full discharge is restricted in the manner which will be described below. For the numerical calculations that were performed, the capacitors all had values of 1 μF and the inductors all had values of 6.338 mH. In FIGS. 2A and 2B, the family of curves represent the different values of $V_{o2}$, i.e., the initial voltage across $C_2$.

As indicated in FIG. 3A, the output current $I_{out}$ through inductor L is relatively large at the time that $V_1$ reaches zero volts and $SCR_2$ is triggered on. This residual current helps to completely pull out the charge that is stored in $C_2$. As indicated in FIG. 3B, the voltage across $C_2$ remains at $V_{o2}$ until $SCR_2$ is triggered on and then $C_2$ fully discharges to zero volts. It should be apparent that in all cases there is a residual current remaining in Lout at the point that $C_2$ is fully discharged. In this case, free wheeling diode 26 provides a bypass path for the residual current in inductor L allowing the inductor to completely discharge and preventing its residual current from reversing the voltage on any of the capacitors. As noted earlier, the residual current could instead be used to discharge yet another capacitor if there were more input stages in the circuit.

Figure 4A:
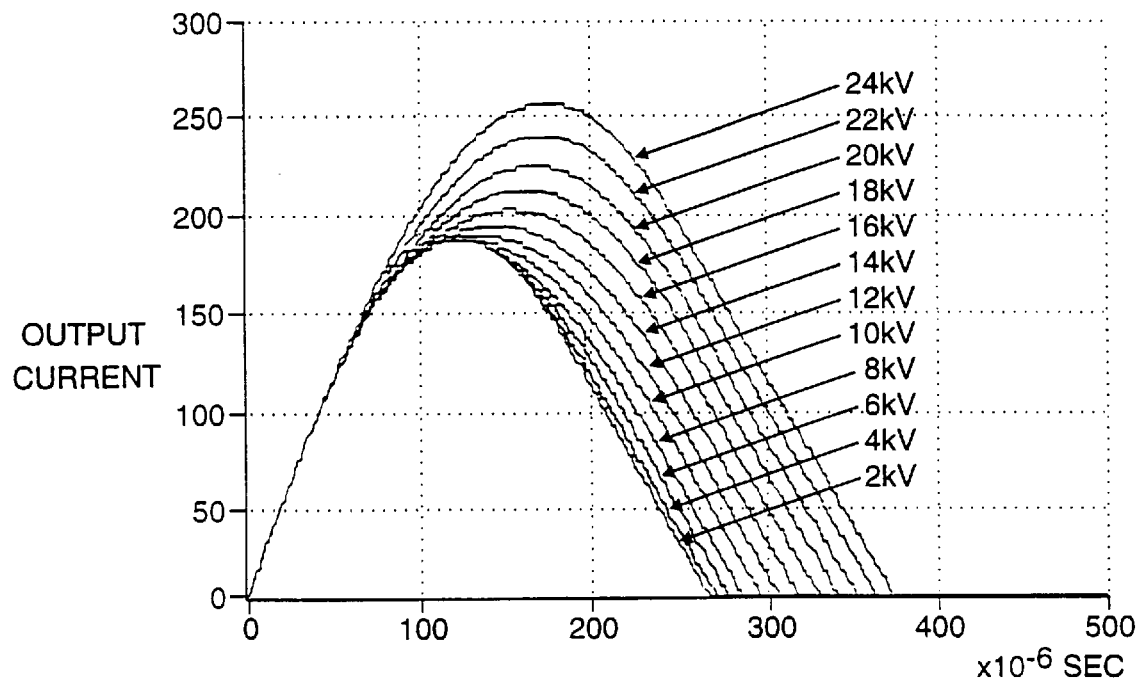
FIG. 4A shows plots of the output current, $I_{out}$, of the circuit of FIG. 1 as a function of time for different values of $V_{O2}$ (for second operating mode)
Figure 4B:
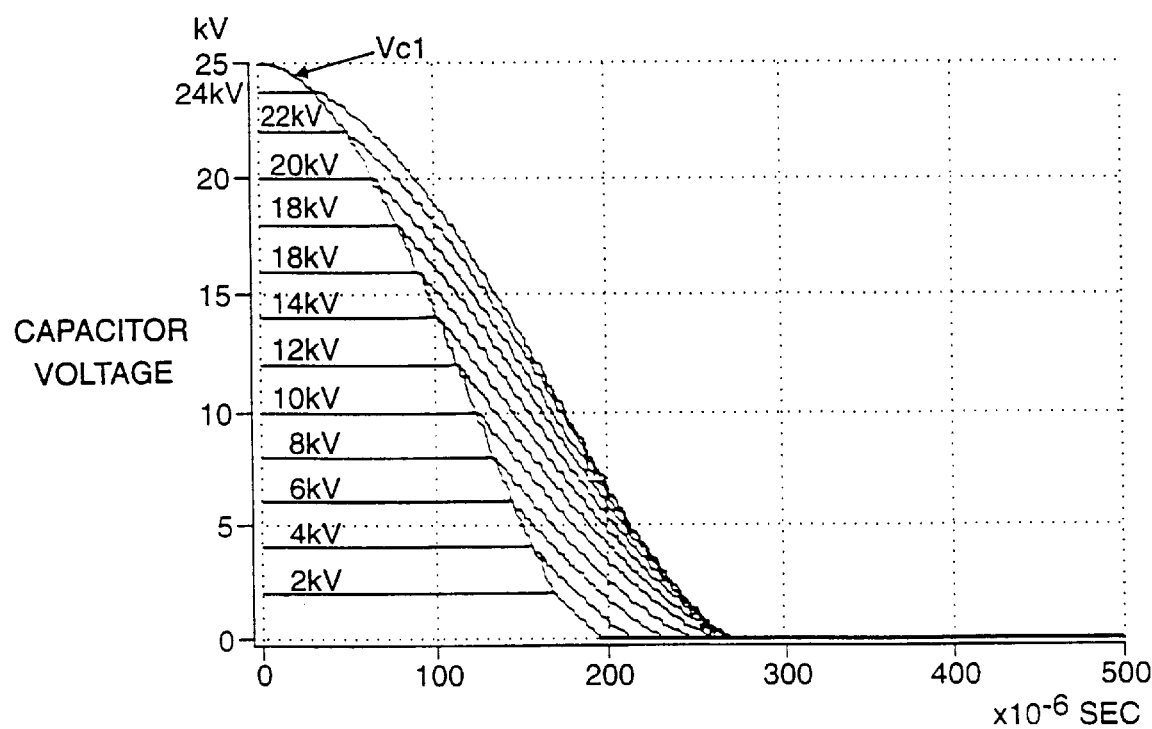
FIG. 4B shows plots of the capacitor voltages, $V_1$ and $V_2$, as a function of time for different values of $V_{O2}$ (for second operating mode)

As noted earlier, sequential discharge may also be performed in a second mode. Instead of triggering the second discharge at the point when the voltage of $C_1$ is zero, one may trigger it at the point when $V_1$ reaches $V_{o2}$, the initial voltage of the second capacitor. By triggering at this point, both capacitors are effectively connected in parallel and are being discharged together. The current and voltage waveform for this type of discharge sequence are shown in FIGS. 4A and 4B, respectively.

Both sequential discharge modes of operation yield about the same discharge periods and require similar components. The first approach (i.e., triggering $SCR_2$ when $V_1$ reaches zero) has the advantage that correct timing of the second phase of discharging is easier to accomplish. From an operational point of view, the second approach (i.e., triggering $SCR_2$ when $V_1$ reaches $V_{o2}$) is more difficult to implement. In the second mode of operation, if the timing of the start of the discharge of the second phase is not accurate, the first capacitor will not be fully discharged.

Sequential Discharge Rectification (SDR)

To summarize what was presented above, the sequential discharge rectification technique involves discharging in sequence all input modules (e.g. capacitors or PCS modules) through a shared output inductor using a shared freewheeling diode. In addition, the modules are discharged in decreasing order of the initial module voltage. The excess energy remaining in the output inductor from the discharge of the first module helps "pull out" energy from the capacitors of the second and third modules, which have lower voltage levels.

Figure 5:
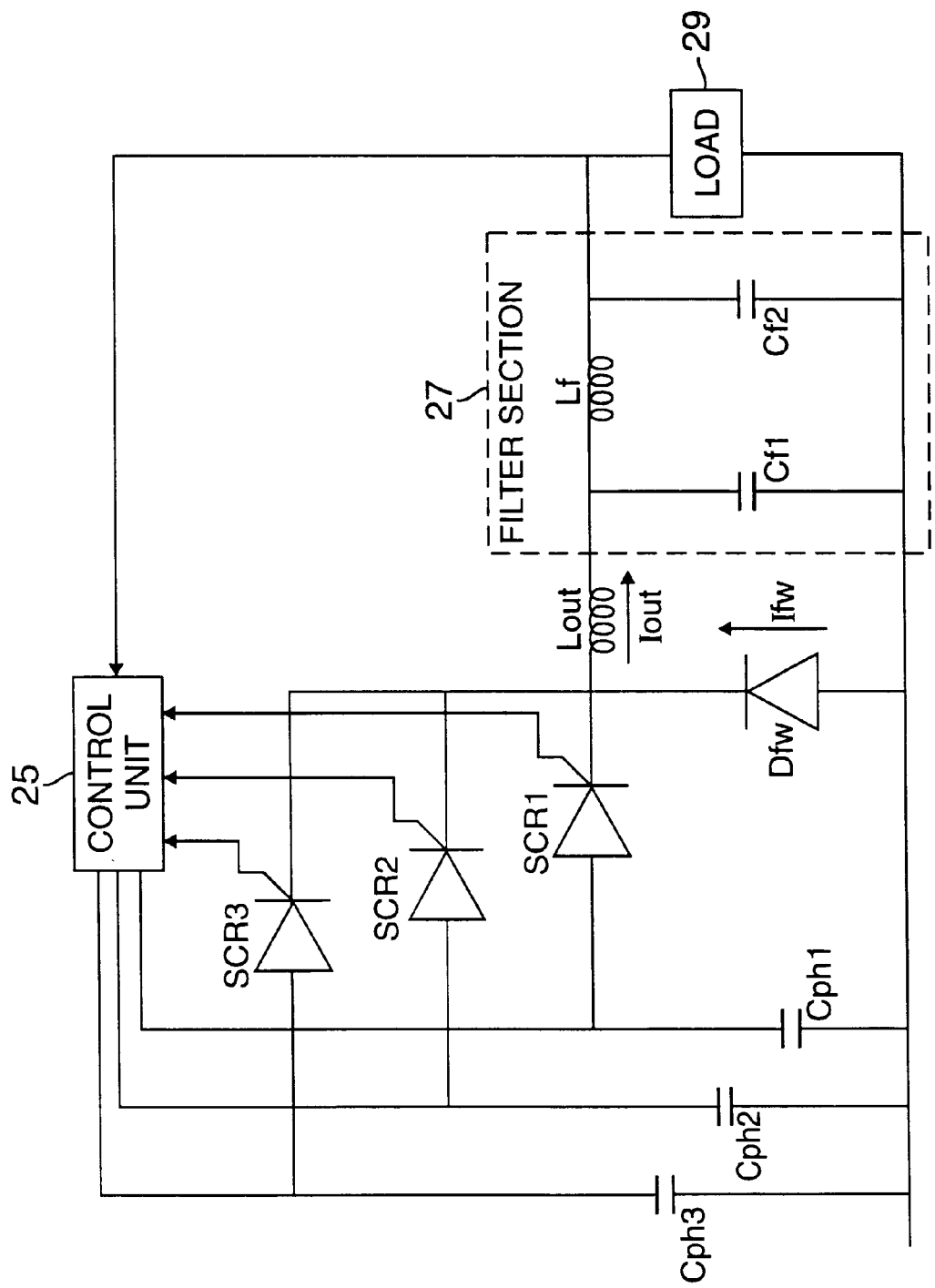
FIG. 5 is a circuit diagram of a sequential discharging circuit for use with a three phase line.

An output section for three phase rectification circuit is shown in FIG. 5. One SCR per phase (i.e., ($SCR_1$ $SCR_2$, and $SCR_3$) discharges a corresponding capacitor ($C_{ph1}$, $C_{ph2}$, and $C_{ph3}$) into a shared output inductor $L_{out}$, which is, in turn, connected through a filter section 27 to a load 30. Filter section 27 filters out any ripples that are caused by the pulsed discharge of the capacitors into the load.

The components of a low-pass output filter are also shown in FIG. 5 in the dashed box. Note that the illustrated filter design is very simple, consisting only of three reactive elements: $L_f$, $C_{f1}$ and $C_{f2}$, connected as shown. Since the energy is dumped into $C_{f1}$, its capacitance should by at least about 3–5 times larger than the capacitance of the storage capacitors, $C_{ph1}$. By selecting a filter cut-off point that is lower than the lowest expected repetition rate of the circuit, a smooth output voltage is produced. The filter can, of course, be of any appropriate design which is capable of eliminating the ripple that the sequential discharge tends to introduce.

As noted previously, the shared output inductor is a key component for the sequential discharge operation since it allows any residual current remaining from the discharge of one capacitor to assist in achieving the complete discharge of another capacitor.

Capacitors, $C_{ph1}$, $C_{ph2}$, and $C_{ph3}$, each represent a different capacitor (in this case, "stack of capacitors") within a corresponding PCS module (not shown). Each PCS module is connected to a different phase of a three phase AC line. In other words, each capacitor is charged to a voltage that is proportional to the absolute voltage of the corresponding AC input phase at that time. It is assumed for purposes of this example that the PCS modules each provide a step-up factor of N. Thus, the voltages across each of the capacitors can be determined as follows:

$V_{C1} = 2 \times |A \sin(\omega t)| \times N$ $V_{C2} = 2 \times |A \sin(\omega t + 2\pi/3)| \times N$ $V_{C3} = 2 \times |A \sin(\omega t - 2\pi/3)| \times N$ where "A" is the AC input voltage amplitude and N is the step up ratio of the PCS module.

As before, a programmed control unit 23 controls the operation of the charging circuit and the sequential discharge circuit (e.g. the triggering of the SCR's).

The capacitor voltages for the three phases are shown in Table I over an angle of 60 degrees (see columns labeled Phase 1, Phase 2, and Phase 3). The numbers are for an rms input voltage of 11 kV and a step-up ratio of N=6. Table I has eight entries separated in time by 7.5 electrical degrees.

TABLE I

| Time (msec) | Phase 1 (Volt) | Phase 2 (Volt) | Phase 3 (Volt) | Triggering Sequence |
| --- | --- | --- | --- | --- |
| 0.174 | 7,049 | 89,618 | 96,657 | 3-2-1 |
| 0.521 | 21,026 | 81,036 | 102,053 | 3-2-1 |
| 0.868 | 34,643 | 71,068 | 105,704 | 3-2-1 |
| 1.215 | 47,667 | 59,885 | 107,546 | 3-2-1 |
| 1.563 | 59,876 | 47,676 | 107,548 | 3-1-2 |
| 1.910 | 71,060 | 34,652 | 105,710 | 3-1-2 |
| 2.257 | 81,030 | 21,036 | 102,063 | 3-1-2 |
| 2.604 | 89,612 | 7,059 | 96,670 | 3-1-2 |

By triggering the charging cycle at the listed times the corresponding capacitor voltages are obtained. Identical voltage combinations are repeated every 60 degrees with the cyclic shift of all the columns to the right.

The SCR's are triggered starting with the capacitor having the highest voltage and proceeding sequentially through the rest of the capacitor in order of decreasing voltage. For each charge cycle, the discharge sequence is as shown in the last column of Table I. For example, look at the entries in the row at time 0.174 msec. The charging cycle associated at that time establishes voltages on $C_{ph1}$, $C_{ph2}$, and $C_{ph3}$ of 7,049, 89,618, and 96,657 volts, respectively. Given the relative ordering of the capacitor voltages, the discharge will be in the following order: $C_{ph3}$, $C_{ph2}$, and $C_{ph1}$.

It can be simply shown, either mathematically or numerically, that the combined energy of the three capacitors is at all times a constant and is given by:

$$E_t = 1.5 \times \frac{C}{2} \times (N^2(2A))^2$$

The quantity of combined charged energy is independent of the phase angle and source frequency. In other words, the combined energy is identical for each and every charge cycle. It follows that if one simply charges and discharges these capacitors together at controlled time intervals, the input power and output power can be independent in time and no synchronization with the AC cycle is required.

Also, by charging each capacitor at constant time intervals, the energy extracted from each line is proportional to the square of the instantaneous voltage. This is exactly what the power flow is into a resistive load. It therefore follows that by using this power extraction method, the power factor of the AC input is identical to unity and no reactive power flow occurs.

Control circuit 23 monitors the load and sets the repetition rate based upon the required throughput that is demanded by the load. If the load or the input voltage changes, a simple feedback loop can adjust the frequency at which the charging/discharging cycles occur to maintain a constant output voltage.

Figure 6A:
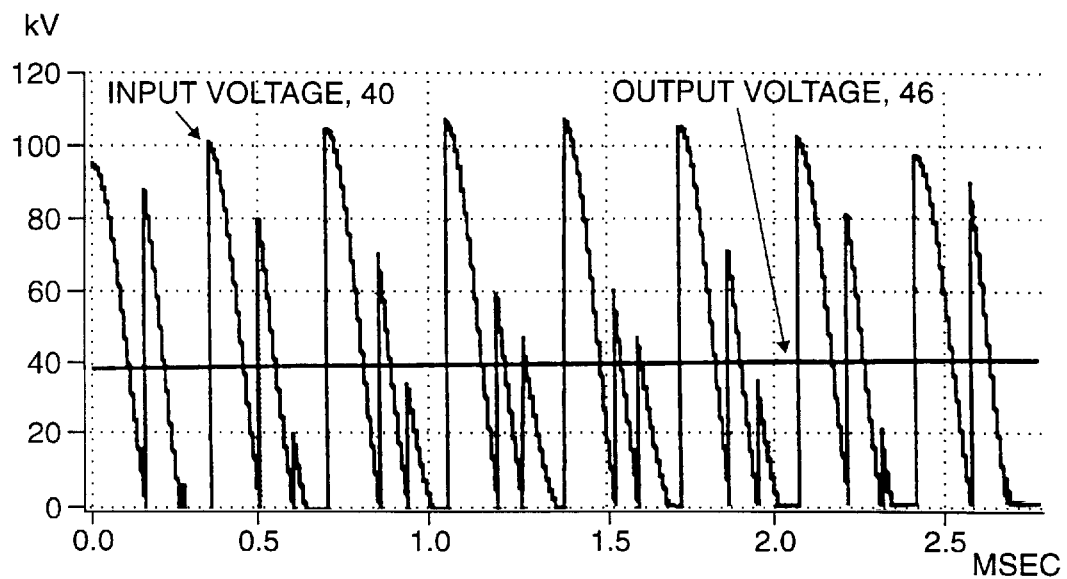
FIGS. 6A and B present a plot of the input and output current and voltage waveforms for the circuit shown in FIG. 1.
Figure 6B:
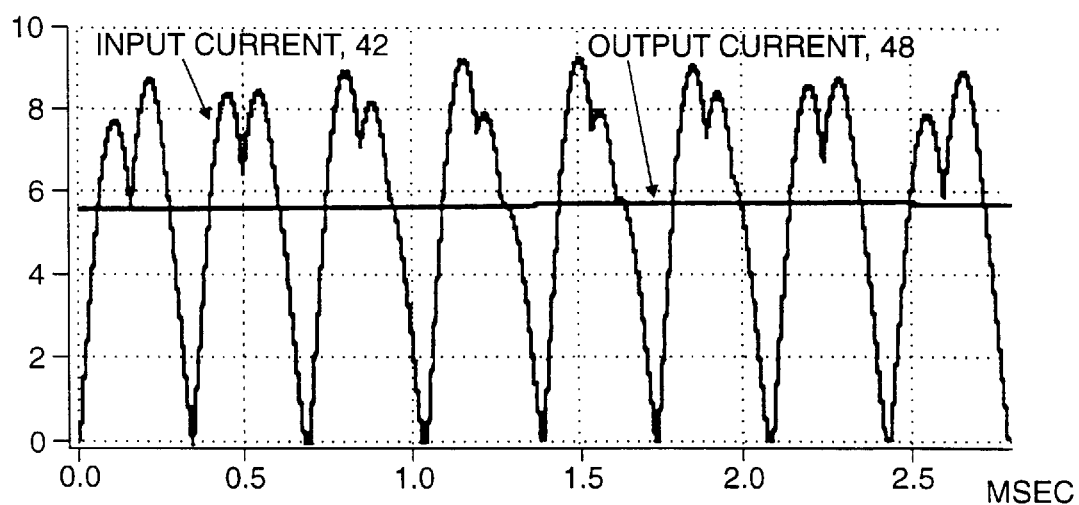

FIGS. 6A and 6B show, respectively, the input voltage waveform 40 and the input current waveform 42 over 60 degrees of a 60 Hz three-phase input, with the capacitors charged to the voltage levels listed in Table II. (Note that in this case "input" refers to the input of the output filter 27.) As can be seen, the input condition of the second 30 degrees is the image of the first 30 degrees. In addition, the input condition is repeated every 60 degrees. FIG. 6A presents the capacitor voltage of the switched on capacitors and the inductor current. As can be seen from the current discontinuities, the inductor current is substantial by the time the second and third capacitors are switched on line. In addition, the inductor and free-wheeling diode current do not have to be zero between consecutive capacitor discharge cycles.

In FIGS. 6A and 6B, the charging of the three capacitors occurs at the same time. It is assumed that the charging time required to charge each of the capacitors through a corresponding input inductor (not shown) takes about 250 $\mu$sec. This determines how frequently the capacitors can be charged and how soon one discharge cycle can follow a previous discharge cycle. It should be noted that to generate the waveforms that are shown, in particular, the repetition frequency of the discharge cycle, there is implied (but not shown for purposes of simplifying the circuit) a second set charging and discharging circuits, including three additional capacitors. The second set of circuits is coupled into the circuit shown in FIG. 5 in parallel with the illustrated set of discharging circuits. Each of the capacitors in the other charging/discharging circuits is coupled to shared inductor $L_{out}$ through a corresponding SCR. While the first set of capacitors (i.e., $C_{ph1}$, $C_{ph2}$, and $C_{ph3}$) is being discharged, the second set of capacitors (not shown) is being charged. In this way, there will always be a set of capacitors that is immediately available for the next discharge cycle without having to wait for a charging cycle to be performed. Thus, the circuit can be operated at a higher repetition rate.

FIGS. 6A and 6B also show the low pass output filter voltage 46 and output current 48. Of prime importance is that both the output current and output voltage are constant. Not shown, but of equal importance, is that both the input voltage and input current of all three phases is sinusoidal and ripple-free even with the use of small low-pass input filters.

Note that as the repetition rate increases so does the ripple frequency. If the low-pass output filter section is designed to handle the lowest repetition rate that is anticipated for the system, it will then handle the higher ripple frequencies that are produced at faster repetition rates.

If thyristors are used for the SCR's, they should have a rapid recovery rate, i.e., a short $t_Q$. Since the discharge is completed within about 250 $\mu$sec, the SCR's will see forward bias in about 125 $\mu$sec. They need to be recovered before they experience the forward voltage. Thyristors having the required recovery are available commercially.

For the conditions described above, the output capacitor values are 9.1 nF, the load is 7 k$\Omega$ for a total power throughput of 225 kW. A much higher throughput can be obtained by using a single string of standard and unparalleled high voltage thyristors for the SCR's. Using typical 8 kA thyristors, an output power of over 200 MW can be obtained with one set of three modules. The same technique can be used in the lower or consumer voltage range. In this regime faster and lower voltage switching devices can be used with a higher switching speed and lower forward voltage drop. This will lead to a more optimized throughput and higher efficiency.

Alternative SDR Configurations:

For rectification applications, the capacitor voltages must always be the same polarity as the output voltage to transfer power out of the system into the load. Since the input voltage to the charging circuit is negative over half of the input waveform cycle, this portion of the waveform cannot be used. This problem can be solved in at least two ways. One approach is to allow the input capacitors to charge to a negative voltage and then use an inversion cycle to flip the voltage to a positive value. The inclusion of the inversion cycle in this later approach reduces the maximum repetition rate that is achievable with the system. Another approach is to generate six phases. Thus, there will always be input waveforms having positive polarity throughout the entire cycle. Examples of these two approaches are described below.

Figure 7:
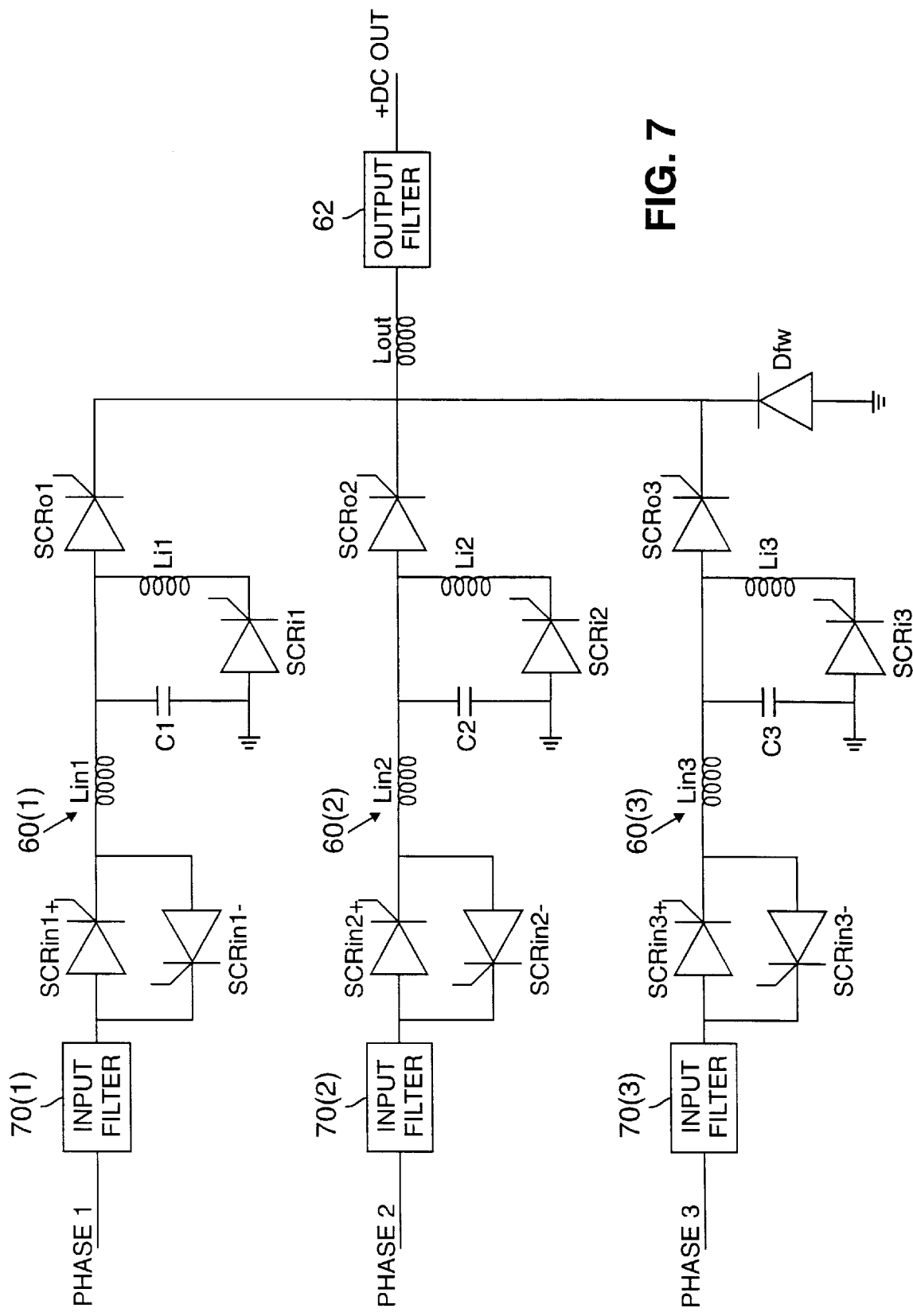
FIG. 7 is a circuit diagram of another charging and sequential discharging circuit for use with a three phase line.

An alternative three phase rectification circuit without transformation (i.e., without using the PCS module for transforming the input waveform) is shown in FIG. 7. The three phases of the AC input line are represented by the inputs labeled Phase 1, Phase 2, and Phase 3. The circuit includes three charging circuits 60(1–3), one for each phase, for charging a corresponding one of three capacitors, $C_1$, $C_2$, and $C_3$. The charging circuit for $C_1$ includes an input filter section 70(1), a pair of SCR's (i.e., $SCR_{in1+}$ and $SCR_{in1-}$) and an input inductor, $L_{in1}$. $SCR_{in1+}$ is for charging $C_1$ from the positive polarity portion of the AC input waveform and $SCR_{in1-}$ is for charging $C_1$ from the negative polarity portion of the AC input waveform. The charging circuits for the other two capacitors (i.e., $C_2$ and $C_3$) are constructed identically to the first charging circuit and thus their corresponding components are similarly labeled.

Each capacitor is resonantly charged through its input inductor from the input phase to which it is connected. For example, $C_1$ is resonantly charged through $L_{in1}$ from phase 1, and similarly for the other capacitors. Thus, the charging period is determined by the selection of the value of the input inductor.

On a three phase line, at any given time there will be either one or two phases which have negative polarity. Thus, the corresponding capacitor(s) will be resonantly charged to a negative voltage. An inversion circuit connected across the capacitor invert the negative voltage after the charging cycle is complete and prior to the discharge cycle. In the case of capacitor $C_1$, the inversion circuit includes an inductor $L_{i1}$ and silicon controlled rectifier $SCR_{i1}$. Similar inversion circuits are connected across the other capacitors $C_2$ and $C_3$. With the inverting circuits, all three capacitors can be made positive prior to the discharge cycle even though they were charged from a negative portion of the input waveform. This simply requires the inclusion of an inverting cycle between the charging cycle and the discharging cycle. Thus, all three phases can contribute to every discharging cycle.

In this rectification circuit of FIG. 7, the discharge circuits are constructed basically as previously described. Each capacitor $C_1$, $C_2$, and $C_3$, is connected through a corresponding one of SCR's (i.e., $SCR_{oi1}$, $SCR_{oi2}$, and $SCR_{oi3}$) into a shared output inductor Lout. The other side of $L_{out}$ is connected through an output ripple filter to a load 62 (e.g. power distribution node). A control unit (not shown) controls the triggering of the SCR's to produce the charging, inversion, and discharging cycles of operation.

Figure 8:
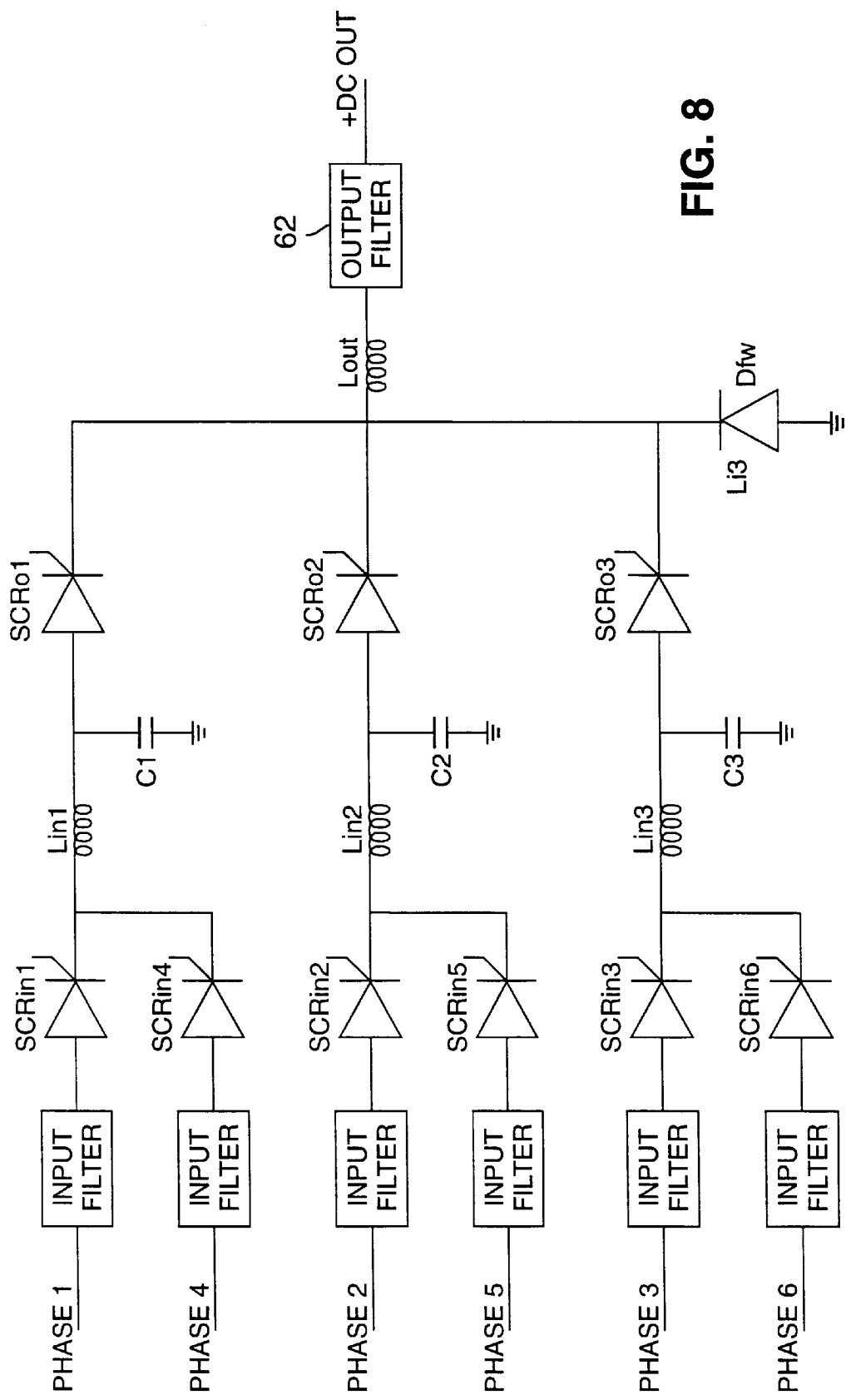
FIG. 8 is a circuit diagram of a sequential discharging circuit for use with a six phase power source.

If a six-phase source is available, the inversion components and the inversion cycle can be eliminated, as shown in FIG. 8. The circuit is the same as that shown in FIG. 7 except that each capacitor can be charged from two phases of the six phase source. Thus, for example, capacitor $C_1$, which is resonantly charged through $L_{in1}$, is connected to Phase 1 through SCRinl and to Phase 4 through $SCR_{in4}$. The two phases from which $C_1$ is charged are selected to be 180° out of phase with each other so that when the voltage of one waveform is negative the voltage of the other waveform is positive. The charging of each of the other capacitors $C_2$ and $C_3$. Thus, at all times throughout the AC cycle, each capacitor can be charged from a positive voltage source. With this arrangement, the inverting circuit are not needed; instead, the triggering of the SCR's is controlled to correctly select that Phase from which power will be extract during each charging cycle.

The configuration of FIG. 8 provides each input phase with the correct polarity, requires no inversion, and permits a 50% higher throughput than for the three-phase throughput. This configuration can be further exploited by adding a second rectification circuit of identical design to generate both a positive and a negative DC output polarity.

Figure 9:
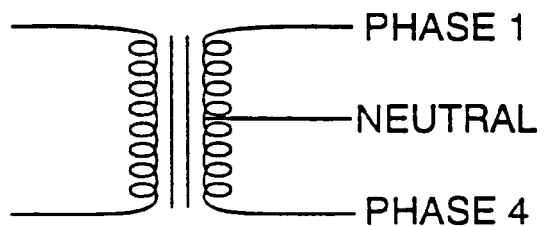
FIG. 9 is an example of a center-tapped transformer for use in generating two phases from a single phase line.

For large power systems, the six phases can be generated simply by using two sets of transformers with half of full ratio. A three phase system can be easily converted to a six phase system with the use of center-tapped transformers, such as are shown in FIG. 9. The center tap of the secondary is the neutral line and the outside lines of the secondary furnish the two phases, one being the inverse of the other.

The six-phase rectification and step-up may also be attractive with transformation. The complexity of the transformation modules can be reduced depending on power throughput. In addition, efficiency can be increased and triggering requirements reduced, since several diodes can be used in place of SCRs.

Another beneficial configuration is rectification of a six-phase power source generating a plus and minus DC output source. The six phases may be made available with small modifications of generators by bringing out three additional phases from the generator windings. Using the typical output of 10 kV a one-step rectification and step-up to a voltage range of ±40 to ±120 kV can be obtained with a power level in excess of 100 MW.

Control Module:

The interpulse separation sets the output voltage to the desired level. The algorithm for controlling the interpulse separation or repetition rate of the charging/discharging cycles is straight forward. Note that the same amount of energy is taken in per pulse of operation. Thus, the power throughput of the system is proportional to $A^2 \times$(repetition rate). If the input voltage drops by 10%, the power throughput will drop by about 20%. To compensate for the 10% drop in input voltage, the repetition rate must be increased by about 20%. Similarly, if the output power drops by 10% (e.g. because loading is less), then to compensate, the repetition rate must be decreased by 10%. If the repetition rate is not decreased, the output voltage will rise.

By measuring the input voltage, the output voltage, and the output current, one has all of the information that is required to control the operation of the system.

Figure 10A:
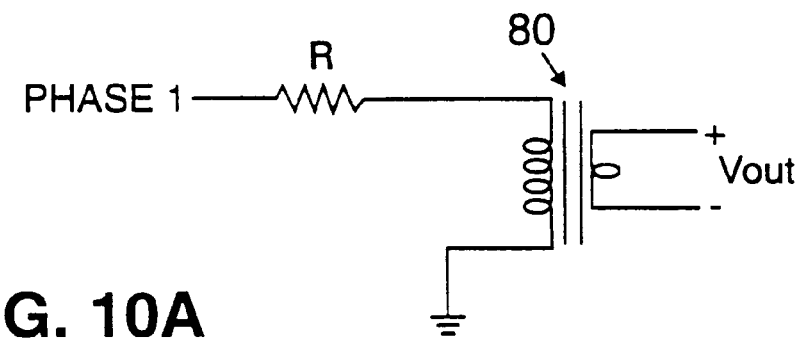
FIG. 10A shows a simple zero crossing detector circuit.
Figure 10B:
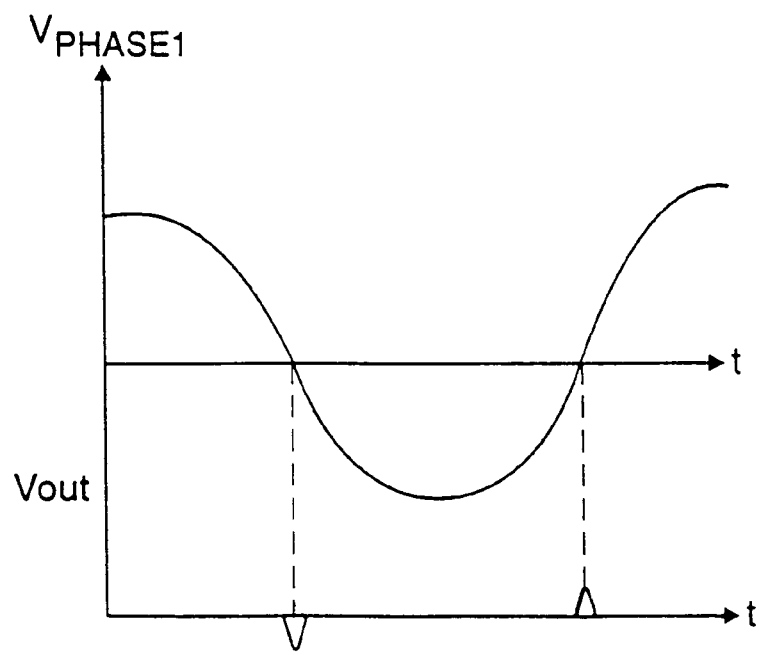
FIG. 10B shows the voltage waveforms on the primary and the secondary of the transformer used in the zero crossing detector circuit of FIG. 10A.

To accurately set the firing sequence, it is necessary to know where you are within the cycle of the input waveform. This can easily be determined by locating the zero crossings of the waveform. One approach to detecting the precise time at which zero crossings occur is to use a small transformer with an easily saturated iron core. Referring to FIG. 10A, such the primary of such a transformer 80 is connected between the phase line and ground with an appropriately large resistor limiting the current through the primary. Throughout most of the AC cycle on the phase 1 line, the core will remain saturated, except for a very short period when the voltage waveform crosses zero. While the core is saturated, the output voltage on the secondary will be zero. When the core comes out of saturation at the zero crossing, a pulse or blip will appear on the secondary marking the precise location of the zero crossing, as illustrated in FIG. 10B.

Rectification with Step-down Transformation

The conversion of power from AC to DC is typically accomplished using a rectification bridge in concert with other active and discrete components. The most common bridge configurations are half-wave, full-wave and six-phase, with the latter producing the most refined output voltage. Less common is the twelve-phase configuration, which can be accomplished by placing two six-phase rectifiers in series. The twelve-phase system minimizes output voltage ripple by increasing the frequency at which power is delivered to the load. In high current applications where the output voltage is relatively low (<50 v), half-wave rectification is used because the inherent losses are lower.

The above-described SDR systems are regulated high power AC to DC converters. The relatively high operating frequency and continuous power transfer produce a ripple-free output voltage that can be effectively regulated by varying the rate of conversion. The conversion process continuously draws current from the source thereby eliminating reactive power generation.

However, the SDR systems depicted in FIGS. 5, 7 and 8, have losses that are even higher than those found in a full-wave bridge rectifier. As in the full-wave bridge rectifier, the above-described SDR systems also use two solid state devices (i.e., SCR's) in series: one for the resonant charge cycle and the second for the discharge cycle. Unfortunately, the SCR's, which are typically multijunction devices, have much larger forward voltage drops than the single junction diodes that are used in the conventional full-wave bridge rectifier (e.g. 2 volts versus 0.7 volts). In low voltage applications where the ratio of the operating voltage to the SCR forward voltage drop to ($V_o/V_f$) is small, the losses can become significant. In applications such as aluminum production, electro-plating or copper refinement where high currents at voltages less than 50 v are required, thus a modified SDR configuration would be more suitable to reduce the impact of the losses on system efficiency.

In general, the modified SDR system includes a front end which performs the sequential discharge functions at high voltage levels and it includes an output stage which uses a small, high frequency transformer to step down the voltage to the required low voltage level. This greatly improves the overall system efficiency by increasing the $V_o/V_f$ ratio of the sequential discharge section of the circuit. The modified SDR system has an efficiency similar to that of the standard half-wave rectifier while eliminating the need for an AC power transformer. The front end which performs the sequential discharge appears as a resistive load to the grid. Thus, it exhibits of the previously described benefits of SDR including harmonic free rectification and producing a power flow of unity power factor.

Figure 11:
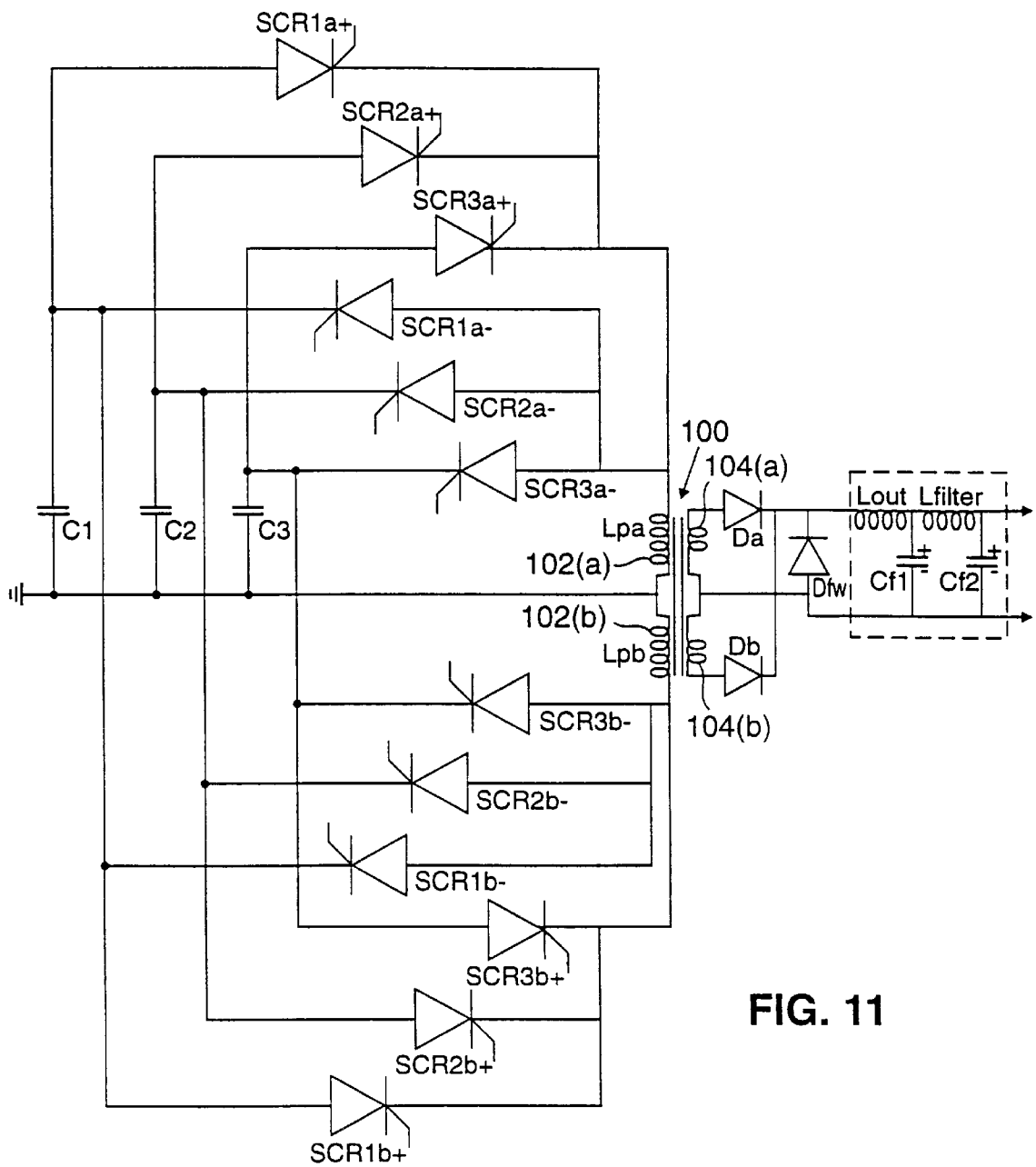
FIG. 11 is a circuit diagram of a circuit which uses sequential discharge in connection with a step-down pulse transformer.

An illustrative configuration is shown in FIG. 11. As before, there are three capacitors, $C_1$, $C_2$, and $C_3$, each of which is charged from some power source, e.g. a three phase line (not shown). The charging circuit for each capacitor might be a corresponding different PCS module or it might be a simple resonant charging circuit, such as is illustrated in FIG. 8. In the latter case, each capacitor $C_1$, $C_2$ and $C_3$ is resonantly charged by an SCR and inductor in series. The resulting voltage on each capacitor will be twice the instantaneous voltage of input line and it will have the same polarity as that instantaneous line voltage. When the resonant charging is complete, the capacitors are sequentially discharged in order of their absolute voltage levels, as has been described previously.

In the circuit of FIG. 11, the capacitors are discharged through a coupling pulse transformer 100 into a shared output inductor, $L_{out}$. Transformer 100 has two primaries 102(a) and 102(b) and it has two secondaries 104(a) and 104(b). Each of the dual secondaries 104(a) and 104(b) is connected to inductor $L_{out}$ through a corresponding one of two output diodes $D_a$ and $D_b$, which select the positive voltage output polarity. The rest of the output section is as previously described. It includes a free-wheeling diode $D_{fw}$ and a low pass output filter section including $L_{filter}$, $C_{f1}$, and $C_{f2}$. Free-wheeling diode $D_{fw}$ assures that any energy remaining in the output inductor $L_{out}$ is transferred to the load following the last capacitor discharge and it also prevents the voltages across the capacitors from reversing after they are discharged to zero volts during the discharging cycle.

An array of SCR's coupling the capacitors to the transformer 100 steer the discharge of each capacitor to the appropriate one of the two primaries 102(a) and 102(b) of transformer 100, depending upon the polarity of the voltage on the capacitor that is being discharged and depending upon the direction of the magnetic flux within the core of transformer 100 from a preceding discharge cycle. Four SCR's (namely, $SCR_{1a+}$, $SCR_{1a-}$, $SCR_{1b+}$, and $SCR_{1b-}$) provide separate discharge paths from capacitor $C_1$ to transformer 100. $SCR_{1a+}$ is used to discharge a positively charged $C_1$ through primary 102(a); $SCR_{1b+}$ is used to discharge a positively charged $C_1$ through primary 102(b); $SCR_{1a-}$ is used to discharge a negatively charged $C_1$ through primary 102(a); and $SCR_{1b-}$ is used to discharge a negatively charged $C_1$ through primary 102(b). A corresponding set of SCR's, which are labeled in a similar manner, are used steer the discharge of capacitors $C_2$ and $C_3$.

A control module (not shown, but previously described) establishes the triggering sequence which assures proper transformer flux reversal from one discharge cycle to the next. The circuit of FIG. 11 permits the use of threephase input power directly, and eliminates the need for both a AC step-down transformer and a polarity inverting transformer.

Note that the use of the dual primary—dual secondary transformer allows one to reverse the magnetic flux in the core from one triggering sequence to the next. This means that an even smaller transformer can be used without fear of saturating its core during operation.

An example of a triggering sequence will now be presented in detail to further illustrate the operation of the circuit shown in FIG. 11. Assume, for purposes of this example, that the three capacitors $C_1$, $C_2$ and $C_3$ are being charged from a three-phase 440 V, 60 Hz AC line and that the trigger rate is 48 times per cycle or 2,880 times per second. The voltage on each capacitor at the end of each charging cycle can be determined by the following equations: $V_{c1}=2{\times}A \sin (\omega t)$ $V_{c2}=2{\times}A \sin (\omega t+2\pi/3)$ $V_{c3}=2{\times}A \sin(\omega t-2\pi/3)$ where "A" is the AC input voltage amplitude of 392 volts.

Table II shows capacitor voltages vs. time and it presents the triggering sequence over an angle of 60 degrees. The table has eight entries separated in time by 7.5 electrical degrees, or every 0.347 msec. The capacitor charge voltage and polarity is shown in columns 2 through 4. Column 5 shows the capacitor discharge sequence, and column 6 shows the SCR triggering sequence.

TABLE II

| Time (msec) | $V_{c1}$ (Volt) | $V_{c2}$ (Volt) | $V_{c3}$ (Volt) | Capacitor Sequence | Triggering Sequence |
| --- | --- | --- | --- | --- | --- |
| 0.174 | 51.3 | 651.8 | −703.0 | 3, 2, 1 | 3b−, 2a+, 1a+ |
| 0.521 | 152.9 | 589.4 | −742.2 | 3, 2, 1 | 3a−, 2b+, 1b+ |
| 0.868 | 251.9 | 516.9 | −768.8 | 3, 2, 1 | 3b−, 2a+, 1a+ |
| 1.215 | 346.7 | 435.5 | −782.2 | 3, 2, 1 | 3a−, 2b+, 1b+ |
| 1.563 | 435.5 | 346.7 | −782.2 | 3, 1, 2 | 3b−, 1a+, 2a+ |
| 1.910 | 516.8 | 252.0 | −768.8 | 3, 1, 2 | 3a−, 1b+, 2b+ |
| 2.257 | 589.3 | 153.0 | −742.3 | 3, 1, 2 | 3b−, 1a+, 2a+ |
| 2.604 | 651.7 | 51.3 | −703.1 | 3, 1, 2 | 3a−, 1b+, 2b+ |

To understand how to interpret Table II, look at the first row where time equals 0.174 msec. A charging cycle occurring at this point in the input voltage cycle, charges each of the capacitors to the voltages shown in the columns labeled $V_{C1}$, $V_{C2}$, and $V_{C3}$. Thus, at the end of the first charging cycle, the voltages on $C_1$, $C_2$. and $C_3$ are +51.3, +651.8, and −703.0, respectively. Since the magnitude of the voltage on $C_3$ is largest and the magnitude of the voltage on $C_1$ is smallest, the discharge sequence will be 3-2-1, as indicated in the column which is entitled "Capacitor Sequence". Since $C_3$ is charged to a negative voltage, either $SCR_{3a\_}$ or $SCR_{3b\_}$ must be used to discharge it through coupling transformer 100. In this case, the choice was $SCR_{3b-}$, as indicated in the column entitled "Triggering Sequence". Once the voltage across $C_1$ reaches zero volts, $C_2$ is discharged through $SCR_{2a+}$, followed by the discharge of $C_1$ through $SCR_{1a+}$. Notice that the SCR's that are selected to steer the discharge are selected to keep the magnetic flux in the transformer core going in the same direction throughout the entire discharge sequence.

At the end of the discharge sequence the voltages on the capacitors will be zero. During the next charging cycle, which occurs at T=0.521 msec, the capacitors will be charged to the voltages shown in the second row of Table II. Since $C_3$ again has the largest voltage and $C_1$ the smallest, the discharge sequence will be the same as before, namely, 3-2-1. This time, however, the SCR's are selected so as to reverse the magnetic flux in the transformer core as compared to the previous discharge cycle. Thus, to discharge $C_1$ instead of triggering $SCR_{3b-}$, the control module triggers $SCR_{3a-}$. When $V_{C1}$ reaches zero, $SCR_{2b+}$ is triggered to discharge $C_2$ and then $SCR_{1b+}$ is triggered to discharge $C_1$.

Figure 12:
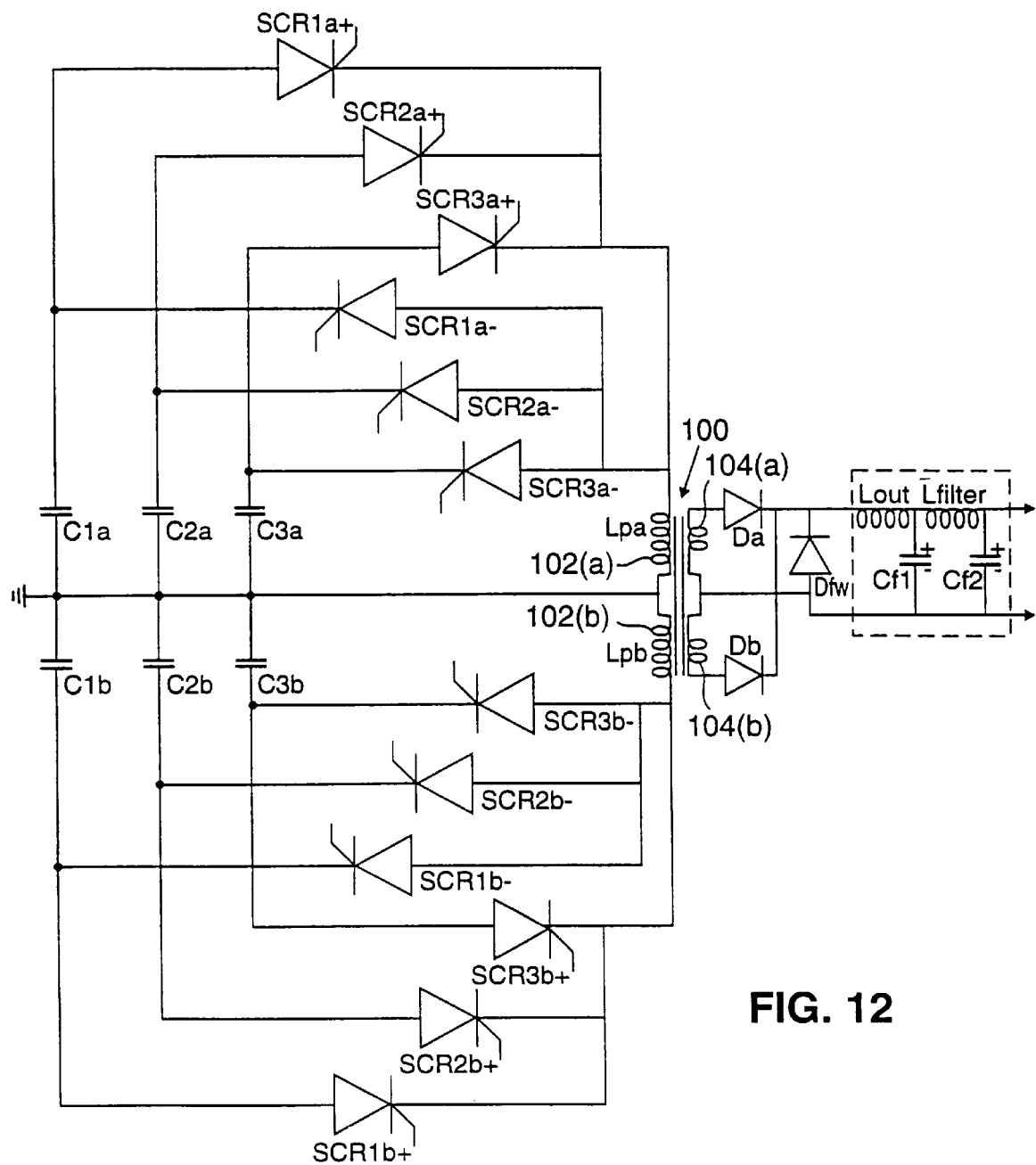
FIG. 12 is a modified version of the circuit shown in FIG. 11 including two sets of input capacitors for increased throughput.

By adding a second bank of capacitors as shown in the dual input configuration shown in FIG. 12, we can effectively double the power throughput of the system. In this configuration, there are two banks of capacitors, an upper bank labeled "a" and a lower bank labeled "b". The upper bank includes capacitors $C_{1a}$, $C_{2a}$, and $C_{3a}$, each of which is charged from a different phase of a three phase input grid.

The lower bank includes capacitors $C_{1b}$, $C_{2b}$, and $C_{3b}$, each of which is also charged from a different phase of a three phase input grid. The capacitors are grouped in pairs (e.g. $C_{1a}$ and $C_{1b}$), each pair being charged from the same phase of the input grid. As one capacitor of a pair is being charged, the other capacitor of that pair is being discharged.

Each of the capacitors in the upper bank is connected to an upper primary 102(*a*) of coupling transformer 100 through two SCR's that are arranged in parallel but with their polarities reversed with respect to each other. For example, $C_{1a}$ is connected to upper primary 102(*a*) through $SCR_{1a+}$ which when triggered allows current to flow from capacitor $C_{1a}$ to upper primary 102(*a*), and through $SCR_{1a-}$ which when triggered allows current to flow from upper primary 102(*a*) to capacitor $C_{1a}$. $SCR_{1a+}$ is used to discharge capacitor $C_{1a}$ when its voltage is positive and $SCR_{1a-}$ is used to discharge capacitor $C_{1a}$ when its voltage is negative. The discharge circuits for capacitors $C_{2a}$ and $C_3a$ are arranged similarly and thus the corresponding components in FIG. 12 are labeled in like fashion.

Similarly, each of the capacitors in the lower bank is connected to a lower primary 102(*b*) of coupling transformer 100 through two SCR's that are arranged in parallel but with their polarities reversed with respect to each other.

This circuit configuration greatly improves the utilization of the thyristors by allowing the first set of capacitors to be charged from the input grid during the discharge cycle of the second set. It also allows the operating frequency to be about twice that of the configuration of FIG. 11. If the operating frequency is doubled, this reduces the filter requirements and lessens the total cost per unit power throughput.

In the dual input configuration, each pair of capacitors (e.g. $C_{1a}$ and $C_{1b}$) shares an input filter, and all capacitors may share an output transformer, output diodes and the output filter. Thus, this configuration also has the effect of lowering the overall system cost.

The doubled operation is shown in Table III. As can be seen, the charging rate and power throughput has been increased by a factor of two. The charging and discharging sequence is identical to than of Table II, except that the rate has been increased.

TABLE III

| Time (msec) | $V_{c1}$ (Volt) | $V_{c2}$ (Volt) | $V_{c3}$ (Volt) | Capacitor Discharge Sequence | Triggering Sequence |
| --- | --- | --- | --- | --- | --- |
| 0.174 | 5.13 | 651.8 | −703.0 | 3b, 2a, 1a | 3b1, 2a+, 1a+ |
| 0.347 | 102.3 | 621.9 | −724.1 | 3a, 2b, 1b | 3a−, 2b+, 1b+ |
| 0.521 | 152.9 | 589.4 | −742.2 | 3b, 2a, 1a | 3b−, 2a+, 1b+ |
| 0.694 | 202.9 | 554.3 | −757.1 | 3a, 2b, 1b | 3a−, 2b+, 1b+ |
| 0.868 | 251.9 | 516.9 | −768.8 | 3b, 2a, 1a | 3b−, 2b+, 1a+ |
| 1.042 | 300.0 | 477.2 | −777.1 | 3a, 2b, 1b | 3a−, 2b+, 1b+ |
| 1.215 | 346.7 | 435.5 | −782.2 | 3b, 2a, 1a | 3b−, 2a+, 1a+ |
| 1.389 | 391.9 | 392.0 | −783.8 | 3a, 2b, 1b | 3a−, 2b+, 1b+ |
| 1.563 | 435.5 | 346.7 | −782.2 | 3b, 1a, 2a | 3b−, 1a+, 2a+ |
| 1.736 | 477.2 | 300.0 | −777.1 | 3a, 1b, 2b | 3a−, 1b+, 2b+ |
| 1.910 | 516.8 | 252.0 | −768.8 | 3b, 1a, 2a | 3b−, 1a+, 2a+ |
| 2.083 | 554.2 | 202.9 | −757.2 | 3a, 1b, 2b | 3a−, 1b+, 2b+ |
| 2.257 | 589.3 | 153.0 | −742.3 | 3b, 1a, 2a | 3b−, 1a+, 2a+ |
| 2.431 | 621.8 | 102.4 | −724.2 | 3a, 1b, 2b | 3a−, 1b+, 2b+ |
| 2.604 | 651.7 | 51.3 | −703.1 | 3b, 1a, 2a | 3b−, 1a+, 2a+ |
| 2.778 | 678.8 | 0.0 | −678.9 | 3a, 1b, 2b | 3a−, 1b+, 2b+ |

Notice that in Table III the time steps have been reduced and there is reference to capacitor banks a and b (for the upper or lower capacitors, respectively).

The trigger timing of the second and third output SCR's, in the sequence shown in Table III, is such that no energy remains in the capacitors and no free-wheeling current flows until the last capacitor is discharged. During normal operation, the maximum free-wheeling current is only a fraction of the total output current. The free-wheeling diode's function is not only to facilitate the full capacitor energy transfer but also to permit output voltage regulation.

The losses in the output diode of a standard half-wave rectification system are identical to those in the free-wheeling diode in a SDR system. For low output voltage systems the dominating losses occur in the output diodes. In either configuration, the total output current has to flow through one of the two diodes. The SDR system overcomes the inherently greater losses by operating at a higher voltage, thus minimizing the current through the switches. The losses in the thyristor are inversely proportional to the input voltage. If the input current is a factor of 20% to 50% higher than the output voltage, the thyristors increase the effective rectification losses by less than 10%. A large SDR installation could efficiently operate directly off the 11 kV substation voltage, thereby reducing the thyristor losses to an insignificant value.

An SDR system operating at a frequency of 1.5 kHz will be able to use a much smaller step-down transformer with a smaller amount of core material than can a system that operates at 60 Hz. The cost savings realized by using a significantly smaller transformer can be used to improve the quality of the core, improving the overall system efficiency without effecting the overall cost. This will, in part or completely cancel the thyristor losses, depending on the detailed operating conditions. Also, it should not be forgotten that SDR systems do not require any harmonic filtering or VAR compensation, therefore, the losses of these components are also eliminated.

The triggering sequences given in Tables II and III are such that the flux in the core is not reversed during a single discharge sequence. This requires a minimum core size based on the full duration of a discharge sequence. The core flux is reversed for the next sequential discharge, completing the transformer output cycle.

The core size can be reduced even further with the same components by reversing the core flux during each output sequence. Selecting a charging and triggering sequence as shown in Table IV meets this objective. The core flux is typically alternated for the first pulse of each consecutive discharged sequence, while the current and flux for the second and third discharge of the sequence is reversed from that of the first discharge. This results in a nearly complete core reset for each sequential output. The net result is an additional reduction of the core size over the cores with the discharge sequence shown in Table II and Table III.

TABLE IV

| Time (msec) | $V_{c1}$ (Volt) | $V_{c2}$ (Volt) | $V_{c3}$ (Volt) | Capacitor Discharge Sequence | Triggering Sequence | Flux Direction |
| --- | --- | --- | --- | --- | --- | --- |
| 0.174 | 51.3 | 651.8 | −703.0 | 3a,2a,1a | 3a−,2a+,1a+ | up down down |
| 0.347 | 102.3 | 621.9 | −724.1 | 3b,2b,1b | 3b−,2b+,1b+ | down up up |
| 0.521 | 152.9 | 589.4 | −742.2 | 3a,2a,1a | 3a−,2a+,1a+ | up down down |
| 0.694 | 202.9 | 554.3 | −757.1 | 3b,2b,1b | 3b−,2b+,1b+ | down up up |
| 0.868 | 251.9 | 516.9 | −768.8 | 3a,2a,1a | 3a−,2a+,1a+ | up down down |

TABLE IV-continued

| Time (msec) | $V_{c1}$ (Volt) | $V_{c2}$ (Volt) | $V_{c3}$ (Volt) | Capacitor Discharge Sequence | Triggering Sequence | Flux Direction |
|---|---|---|---|---|---|---|
| 1.042 | 300.0 | 477.2 | −777.1 | 3b,2b,1b | 3b−,2b+,1b+ | down up up |
| 1.215 | 346.7 | 435.5 | −782.2 | 3a,2a,1a | 3a−,2a+,1a+ | up down down |
| 1.389 | 391.9 | 392.0 | −783.8 | 3b,2b,1b | 3b−,2b+,1b+ | down up up |
| 1.563 | 435.5 | 346.7 | −782.2 | 3a,1a,2a | 3a−,1a+,2a+ | up down down |
| 1.736 | 477.2 | 300.0 | −777.1 | 3b,1b,2b | 3b−,1b+,2b+ | down up up |
| 1.910 | 516.8 | 252.0 | −768.8 | 3a,1a,2a | 3a−,1a+,2a+ | up down down |
| 2.083 | 554.2 | 202.9 | −757.2 | 3b,1b,2b | 3b−,1b+,2b+ | down up up |
| 2.257 | 589.3 | 153.0 | −742.3 | 3a,1a,2a | 3a−,1a+,2a+ | up down down |
| 2.431 | 621.8 | 102.4 | −724.2 | 3a,1b,2b | 3b−,1b+,2b+ | up down down |
| 2.604 | 651.7 | 51.3 | −703.1 | 3a,1a,2a | 3a−,1a+,2a+ | up down down |
| 2.778 | 678.8 | 0.0 | −678.9 | 3b,2b | 3b−,2b+ | down up |

SDR systems have several advantages over standard half-wave rectification systems. The output can be precisely regulated, and one can provide short circuit protection and fast disconnect capability. Should a fault occur, the system can be shut down in less than one millisecond. Only the residual energy stored in the filter capacitor can rush into the fault. With the typical energy stored in the filter capacitors this is generally less than the energy used in 2.5 milliseconds.

To see how the SDR system stacks up against a system of similar performance, one could compare it with a phase-control regulated system with regulated output and fault protection. A phase-control regulated system increases the half-wave system losses by the losses of the phase-control thyristors. Assumed to be on the input side of the AC step-down transformer, the additional losses equal that of the SDR thyristors and make the total solid-state device losses for both systems identical. Furthermore, the phase control devices produce additional harmonics that need to be neutralized with additional and larger harmonic filters.

Using the SDR technology will significantly reduce transformer size, as well as system size and volume. The transformer couplings, in conjunction with sequential discharging, permits several different electrical configurations. Multiple input transformer windings may be used. For example, one is not restricted to use the phase-to-neutral configurations implied in FIGS. 11 and 12. Instead, one may use the phase-to-phase input voltage directly in conjunction with isolated transformer windings. This opens up additional options and, for some applications, improves the performance even further.

In addition, full wave rectification may replace the half wave rectification if the required output voltage level is higher.

Figure 13:
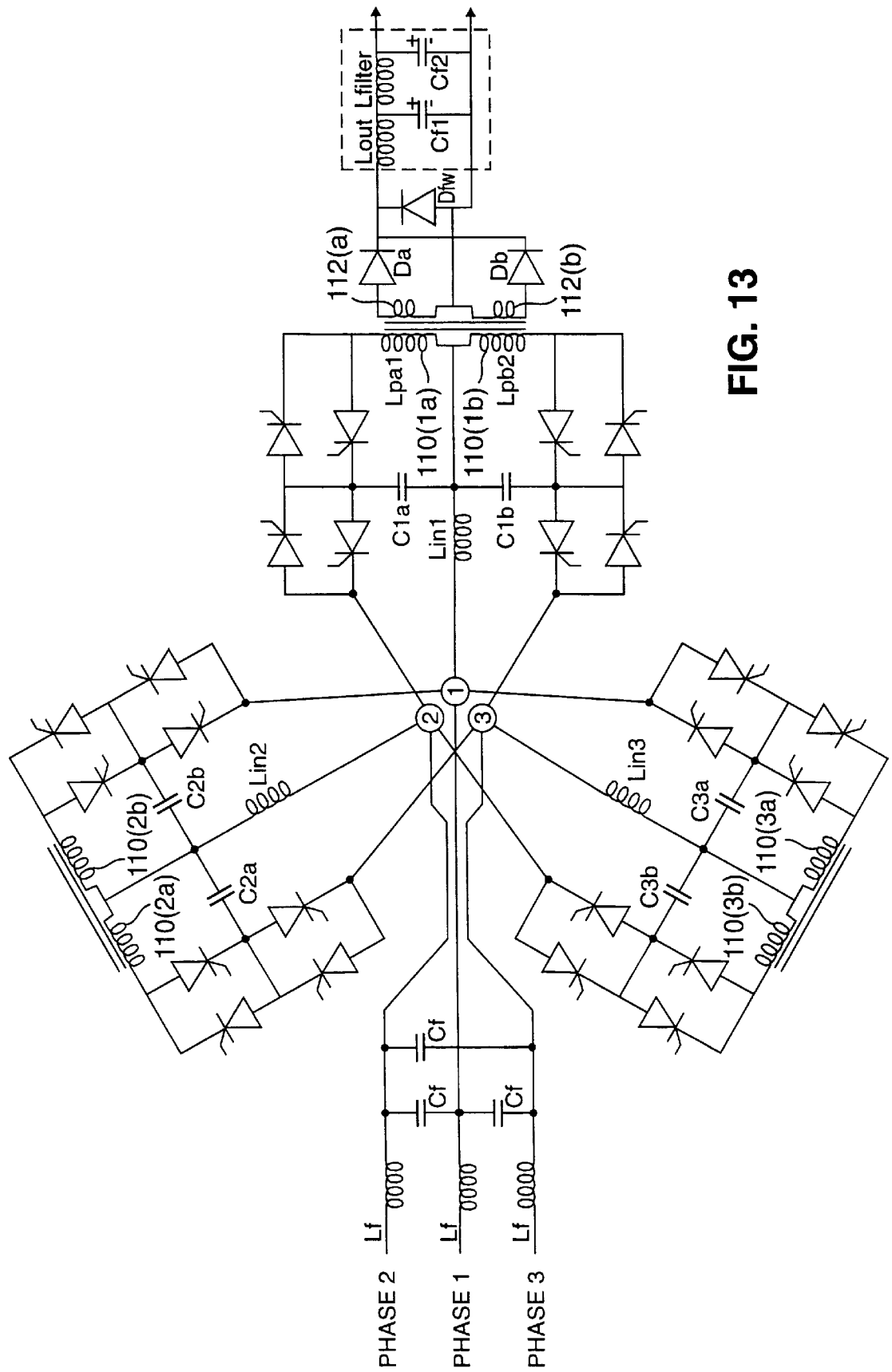
FIG. 13 is another modified sequential discharge rectification circuit which employs a phase-to-phase input section.

FIG. 13 shows a three-phase configuration that permits charging directly from a three-phase grid using a phase-to-phase input. Six capacitors, labeled $C_{1a}$, $C_{1b}$, $C_{2a}$, $C_{2b}$, $C_{3a}$, and $C_{3b}$, make up two separate sets of three capacitors that can be charged and discharged alternately, as described above. The circuit of FIG. 13 uses three dual primaries 110(1a) and 110(1b), 110(2a) and 110(2b), and 110(3a) and 110(3b), and one dual secondary 112(a) and 112(b), permitting flux reversal for each capacitor discharge within a discharge cycle. The system is configured so that each pair of capacitors (i.e., $C_{1a}$ and $C_{1b}$, $C_{2a}$ and $C_{2b}$, and $C_{3a}$ and $C_{3b}$) has in its output leg a corresponding pair of dual primaries which makes it possible to reverse the flux between alternate discharges, as previously described in connection with FIG. 12. In each case, the shared output inductor $L_{out}$ is the one being 'charged'.

Note that FIG. 13 also includes the input charging circuits for all of the capacitors. The power from each phase is filtered by a low pass filter which, in this example, includes a series inductor $L_f$ and a shunt capacitor $C_f$. Each of the capacitors is then resonantly charged through an inductor $L_{INi}$ (where I=1,2,3). The charging cycles for each capacitor are controlled by a pair of parallel SCR's. the discharging circuits are the same as those which were illustrated in FIG. 12, except that each pair of capacitors (e.g. $C_{1a}$ and $C_{1b}$) is connected to a different dual primary instead of the same dual primary (e.g. in the case of $C_{1a}$ and $C_{1b}$ it is dual primaries 110(1a) and 110(1b)).

The discharging is controlled so that a first set of capacitors, consisting of $C_{1a}$, $C_{2a}$, and $C_{3a}$, may use one set of three primary windings during one discharge phase while a second set of capacitors, consisting of $C_{1b}$, $C_{2b}$, and $C_{3b}$, uses the other set of three primary windings during the next discharge phase. In this way, the voltage polarity is reversed on each dual winding per charge and discharge cycle. Typically, the core would see an operation similar to that covered in Table IV.

Finally, a transformer, configured as in the previous operation, would create a complete flux reversal only between each charge and discharge cycle. This would correspond to the operation as described in Table III. Depending on the operating conditions and component characteristics, each configuration (i.e., the circuits of FIGS. 11, 12, and 13) may have an advantage over the other two. The second operating configuration (i.e., FIG. 12) would permit use of a smaller total core volume, while the first and third configurations (i.e., FIGS. 11 and 13) might be more appropriate for high power throughput requirements.

The transformer-coupled configuration permits isolation between the primary and secondary and increases system flexibility. This permits the secondary to float and permits the use of the phase to phase voltage or a dual input power system. In addition, a standardized input section with optimum design might be developed for many different output voltage requirements. Only the output transformer and filtering section need to be modified for the different voltage requirements. No problems can occur while parallel modules are operational, since the power throughput sharing can be precisely controlled.

In summary, the SDR can be adopted to any voltage range of interest with high efficiency with the use of a high frequency output transformer. This permits the sequential control to be performed at a high voltage to minimize the thyristor losses. In addition, this technique produces a reduction in cost, losses, volume and weight of the AC step-down transformer.

Using Transformer Input/Output with the PCS

Step-Up Configurations:

As indicated in the earlier patent, an advantage of the Power Conditioning System (PCS) is that it requires no transformer or AC link to change the voltage. Eliminating AC transformers from the power distribution system significantly reduces complexity and cost, increases efficiency, and most importantly appeals to the technical community. However, as suggested above, there may be instances in which it is beneficial to also use transformers in the PCS system.

For example, note that the PCS losses are mainly switching losses from the thyristors. It can be shown that the loses (i.e., $\eta$) are approximately equal to:

$$\eta(\%)=100 \times 2 \times (V_f/V_o) \times (N+2);$$

where N is the transformation ratio of the PCS, $V_f$ is the forward voltage drop of the switch, and $V_o$ is the switch voltage operating level. The advantage of a thyristor is that devices up to $V_o$=12,000 volts are available for efficient high voltage operation. Since the typical thyristor has a forward voltage drop of $V_f$=2.0 volts, the efficiency is better than 99.5% for a transformation ratio on the order of N=10. The problem, however, is that thyristors, both SCRs and GTOs, are four layer devices with a voltage drop that is independent of the operating voltage. Therefore, it follows that if we use a thyristor for low voltage operation, such as 10 volt solar or fuel cells or 110 volt consumer power, the ratio $(V_f/V_o)$ is high, thus lowering the overall efficiency of the system. If lower input voltages are used to generate higher output voltages, the transformation ratio N also needs to be larger, thereby causing an additional reduction in efficiency. With such losses, the PCS would have limited appeal in consumer markets and some industrial markets in comparison to alternative more conventional approaches. However, by adding a pulsed transformer to the PCS that operates at high frequencies, the efficiencies can be significantly improved and the overall transformation ratio can also be increased.

Figure 14:
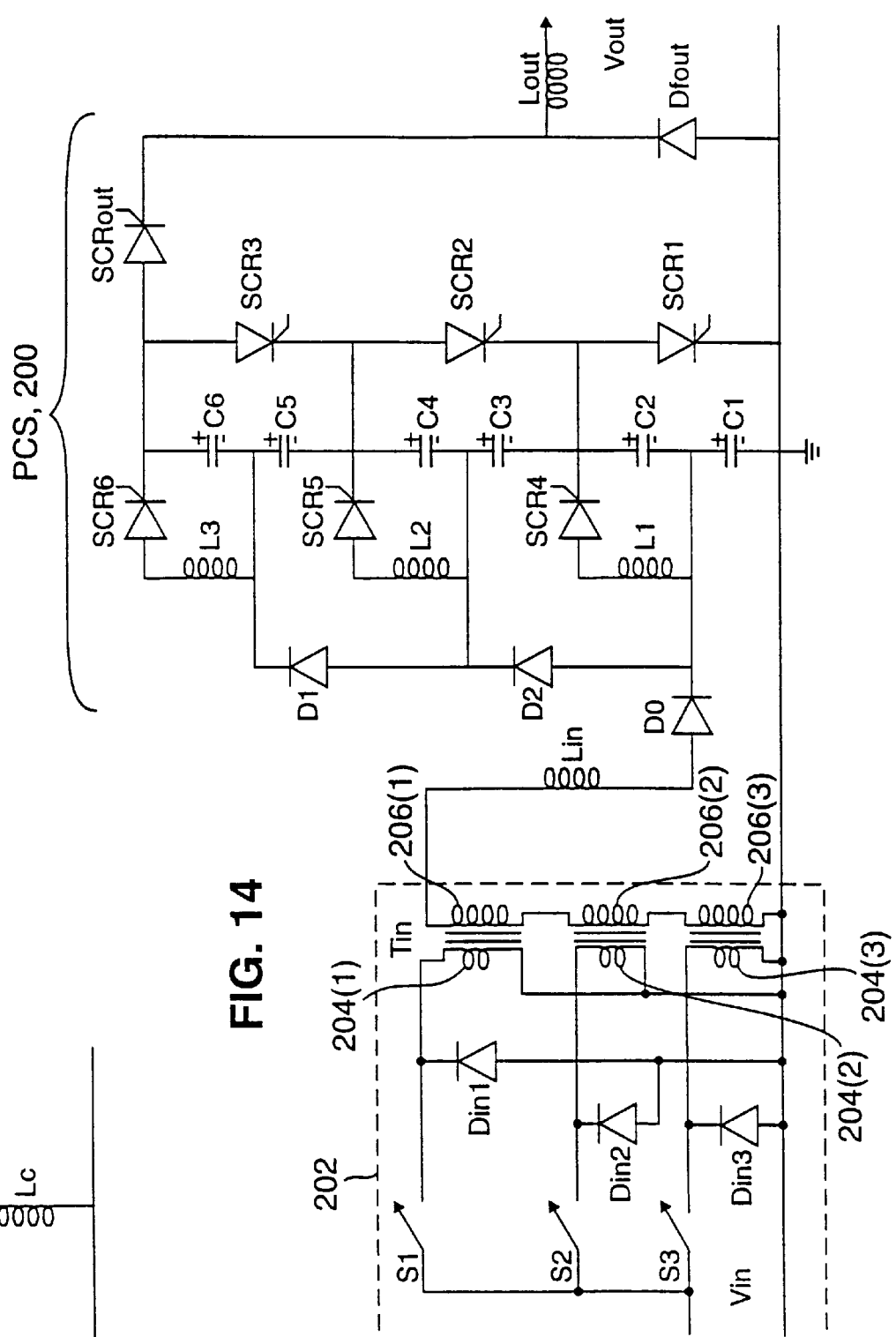
FIG. 14 is a circuit diagram of a PCS with a transformer coupled input section.

In this hybrid configuration, which is used for medium power, lower voltage operation, the pulsed transformer can be either added to the input or the output of the PCS. If the initial voltage is in the low voltage range and it must be stepped up to a higher voltage, the transformer would be added to the input side. If the input voltage is high and it must be stepped down, then the transformer would be added on the output side. To illustrate this approach, I will first describe a PCS step-up circuit using a modified low voltage input, as show in FIG. 14.

The circuit includes a basic step-up PCS module 200 connected to a pulsed transformer input section 202. The basic PCS circuit is a 1:6 voltage step-up configuration constructed as described in U.S. Pat. No. 5,270,913, with the exception that a diode ($D_o$) is used in place of an SCR on the input side of the PCS module.

Pulsed transformer input section 202 includes a transformer $T_{IN}$ configured to step-up the input voltage by a moderate amount. In the described embodiment, transformer $T_{IN}$ includes multiple (e.g. three) primary input windings 204(1), 204(2), and 204(3) operated in parallel and three secondary windings 206(1), 206(2), and 206(3) connected in series. Depending on the magnetics design, one may either use a separate transformer core for each primary input winding or a single core with multiple primary input windings. In the illustrated embodiment, three cores each with an associated secondary winding are used. In this configuration, the effective transformer step-up ratio is the product of the number of cores times the turns ratio of each transformer section.

Transformer input section 202 also includes three input switches labeled $S_1$, $S_2$, and $S_3$, each of which controls the power to a corresponding one of the primary windings. This configuration permits good current sharing control and full average current rating utilization. Transformer input section 202 steps-up the input voltage before it is applied to the PCS charging system. This permits us to operate the SCR's (e.g. thyristors) in the PCS module at a higher voltage and thus achieve a higher efficiency, since both the $(V_f/V_o)$ ratio and the PCS multiplication of N (N=6) is kept low.

Solid state switching devices have been developed to operate at the low to medium voltage ranges with a significantly lower forward voltage drop than is found in thyristors. Examples of devices which can be used for the switches $S_1$–$S_3$ are power FET's, IGPT's and, depending upon the application, even conventional bipolar transistors.

Figure 15:
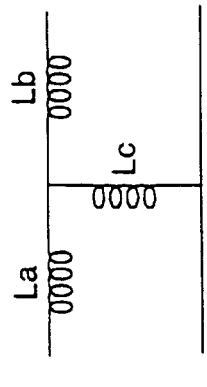
FIG. 15 is an equivalent circuit of the transformer shown in FIG. 14.

The pulsed input transformer is shown in an equivalent configuration in FIG. 15. It includes an input inductance $L_a$, an output inductance $L_b$, and a shunt inductance Ls. Typically, shunt inductance $L_s$ is large so that, from an operational point of view, the charging inductance as seen by the transformer input section consists of three inductors in series: $L_a$, $L_b$, and $L_{in}$.

The operation of the circuit includes a charge cycle, an inversion cycle, and a discharge cycle. During the charge cycle, capacitors $C_1$–$C_6$ of the PCS module are all charged to the same voltage from the power source. During the inversion cycle, the voltages on capacitors $C_2$, $C_4$, and $C_6$ are inverted with the aid of inductors $L_1$, $L_2$, and $L_3$, respectively. And during the discharge cycle, the charge that was stored in the series connected capacitors $C_1$–$C_6$ is injected at the transformed voltage into a load through output inductor, $L_{out}$.

Charging is started by simultaneously closing the low voltage input switches $S_1$, $S_2$, and $S_3$ and triggering the return current thyristors $SCR_1$, $SCR_2$, and $SCR_3$. Assuming that the transformer ratio is N, then each of the capacitors will be resonantly charged through a resonant charging inductor $L_{IN}$ to $2 \times 3 \times N \times V_{IN}$. Note that diode $D_o$ prevents capacitor $C_1$ from discharging through the secondary pulse transformer.

In this voltage step-up mode, the capacitor string is charged in an alternating sequence such that each adjacent capacitor has the opposite voltage polarity. The voltage of the capacitor string, when fully charged, is thus zero. The charging period is defined by the input charging inductance (i.e., $L_{IN}+L_a+L_b$) and the parallel capacitor value (i.e., six times $C_1$, assuming the capacitors are all of the same value).

With $SCR_1$, $SCR_2$, and $SCR_3$ recovered, the triggering of $SCR_4$, $SCR_5$, and $SCR_6$ starts the inversion cycle. The purpose of the step-up inversion cycle is to change the polarity of half of the capacitors in the capacitor string such that all of the capacitors have the same polarity. In the circuit shown in FIG. 14, the polarity of capacitors $C_2$, $C_4$, and $C_6$ are reversed to generate a positive output voltage. The SCR's are important for the inversion process because they prevent the current from ring back through the inductor and allow the extraction of the inverted energy in an efficiently and controlled fashion.

At the conclusion of the inversion cycle, the total voltage across the string of series connected capacitors (i.e., $C_1$ through $C_6$) will be six times the voltage across $C_1$ (or twelve times the output voltage of the transformer). The positive voltage across the $C_1$ to $C_6$ capacitor stack can then be switched to the output by another SCR (i.e., $SCR_{out}$).

Note that as previously described, the sequence of charging, inversion, and discharging occurs multiple times per second, e.g. 1–2 kHz or higher. Thus, if the voltage source is a 60 Hz AC voltage source, then $V_{IN}$ to transformer input section 202 is the instantaneous voltage of the AC voltage waveform at the time at which the charge cycle. The components are selected so that the charge cycle, the inversion cycle, and the discharge cycle can each complete in a short time, e.g. shorter than 1 ms.

Assuming that we start out with a low voltage ($V_{in}$) from a low voltage power source such as solar cells, storage batteries or fuel cells, the input voltage will be significantly lower than 100 volts and the required step-up ratio that is required will typically be much higher than 6. If only a PCS module were to be used to handle the entire transformation, the low input voltage and the high step-up ratio that is required would result in poor efficiency. However, by using the pulsed transformer input section to provide some of the step-up transformation, the overall efficiency of the circuit can be greatly improved.

Figure 16:
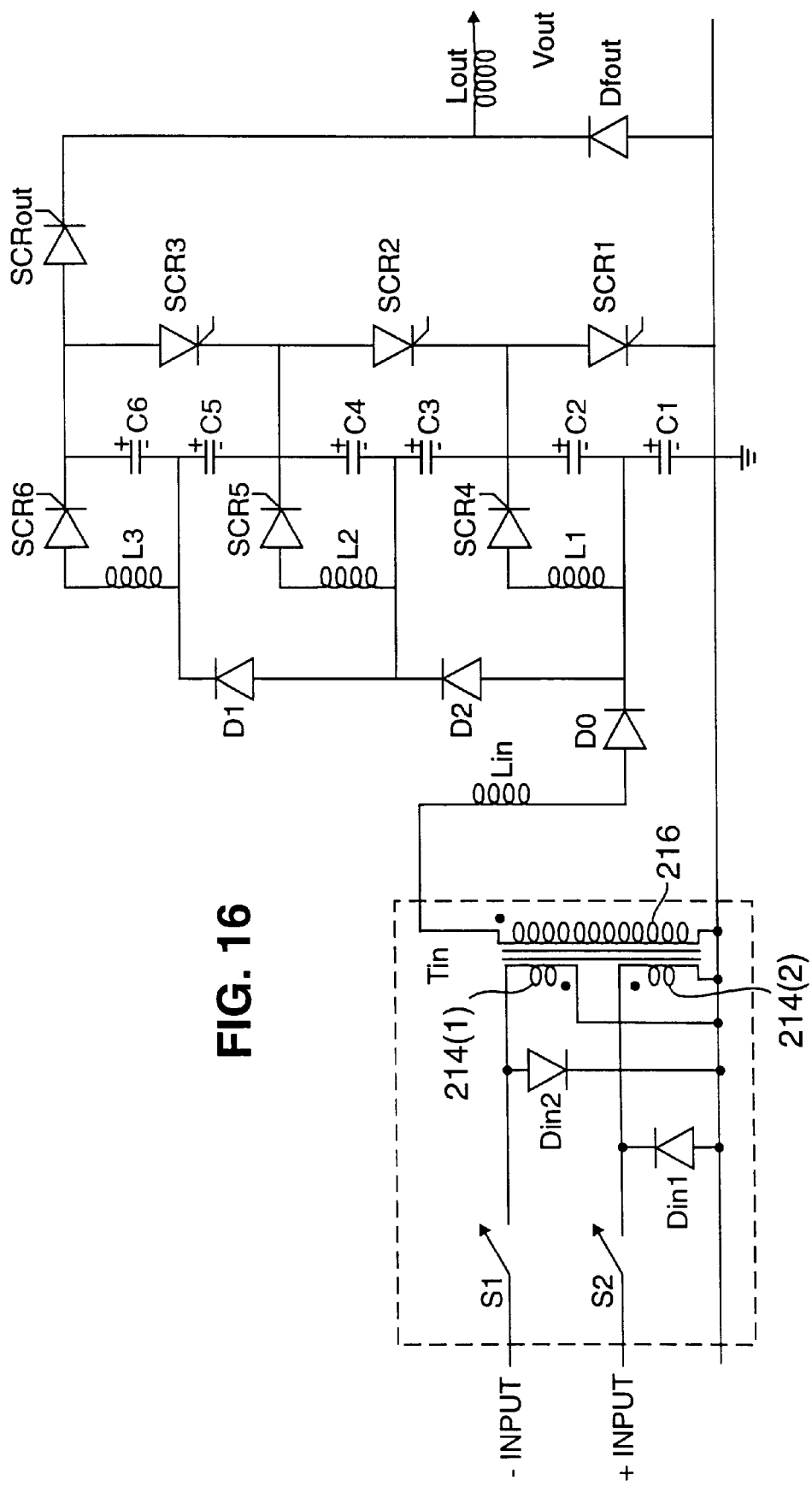
FIG. 16 is a circuit diagram of a PCS with a dual polarity transformer coupled input section.

Additional windings may be used on each core to implement additional input from separate voltage sources or sources of opposite polarity. An example of such an implementation is shown in FIG. 16. In that case, a dual polarity source, identified as −Input and +Input, is used. In this case, transformer input section 212 includes a pulse transformer with two primary windings 214(1) and 214(2) wound in opposite directions around a common core. A secondary winding input 216 is connected to the input side of the PCS module as previously described. In all other respects, the circuit is the same as that shown in FIG. 14 and thus the other components are similarly identified.

To utilize both polarities of the AC input waveform in the basic PCS module, it is necessary to add thyristors in parallel (but of opposite polarity) with the thyristors in the charging and inversion circuits. As can be seen, in the embodiment of FIG. 16, the second set of thyristors is not necessary. Thus, this modified circuit with the dual polarity input section significantly reduces the parts count and cuts the probability of thyristor failure nearly in half, in comparison with a basic PCS module without a transformer input section. In addition, if diodes are be used for the PCS interstage isolation components, such as $D_1$ and $D_2$ in FIGS. 14 and 16, additional benefits are obtained. First, the use of a high voltage diode with only one junction for a thyristor which has three junctions, reduces the losses in those locations where this substitution is possible. Secondly, the control system is simplified, since diodes require no triggering. And finally, the cost is reduced, since diodes with similar power ratings are less expensive.

As indicated above, each input may have several switches and cores connected in parallel. This concept may be extended to multiple input sources in polarity and/or AC phases, and to multiple AC sources. In addition, the capacitor charging voltage may be regulated by using input switch on/off control, of specific benefit for lower power flow and input/output filter optimization.

Figure 17:
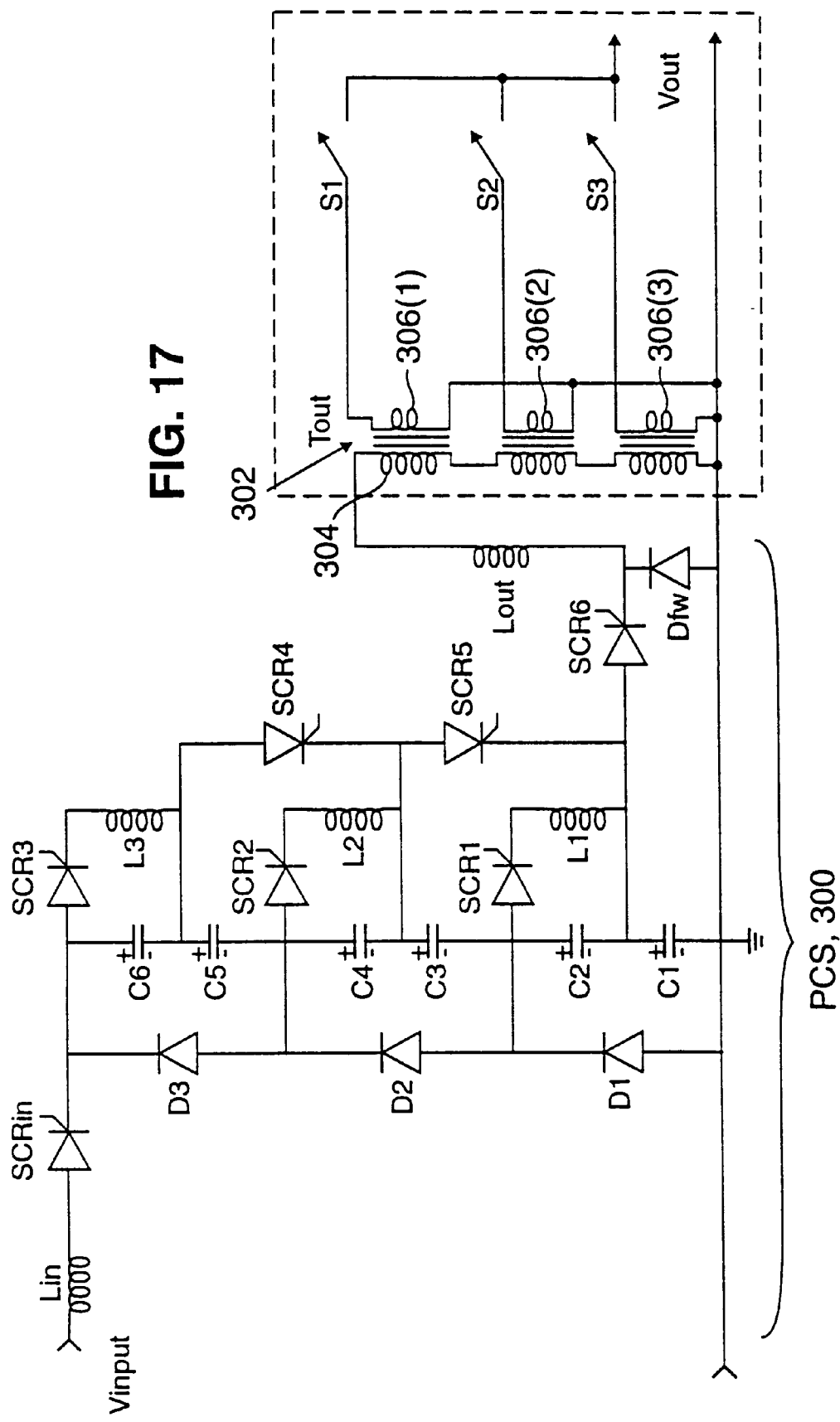
FIG. 17 is a circuit diagram of a PCS with a transformer coupled output section.

Step-Down Configurations:

A transformer may also be used in a step-down configuration, as shown in FIG. 17. In this example, a PCS module 300, which is configured as a step-down module, is used as a high voltage input section to the circuit. An additional step-down ratio is obtained by then using a low-loss, output step-down pulse transformer(s) 302 at the low voltage end. Transformer 302 include a primary 304 and three secondaries 306(1), 306(2), and 306(3). One side of each secondary is connected to ground and the other side of each secondary is connected through a corresponding one of low loss, low voltage switches ($S_1$, $S_2$, and $S_3$) to the output node 308. In this example, the step-down ratio from the primary to each secondary is 1/N; thus the overall step-down ratio of the transformer is 1/3N.

As before, there is a charge cycle, an inversion cycle and a discharge cycle. During the charge cycle, $SCR_{IN}$ is triggered and the series connected chain of capacitors $C_1$–$C_6$ is resonantly charged through $L_{IN}$ up to 2 $V_{INPUT}$. During the inversion cycle, $SCR_1$, $SCR_2$, and $SCR_3$ are simultaneously triggered to enable inductors $L_1$, $L_2$, and $L_3$ to invert the voltages across each of capacitors $C_2$, $C_4$, and $C_6$, respectively. Finally, during the discharge cycle, $SCR_4$, $SCR_5$, and $SCR_6$ are triggered to discharge the capacitors, which are now configured in parallel arrangement through diodes $D_1$, $D_2$, and $D_3$. The discharge is through output inductor $L_{OUT}$ into the primary 304 of transformer 300. Simultaneously with the triggering of $SCR_6$, switches $S_1$ through $S_3$ are also turned on to allow the injection of the energy from the output of transformer 300 to be delivered to the output node, which might by a power distribution point or a terminal of a load (not shown).

As in the case of previous embodiments, the pulsed operation (consisting of a charge cycle, an inversion cycle, and a discharge cycle, occurs many times per second, e.g. 1–2 kHz.

Switches $S_1$ through $S_3$ can be implemented by any one of a wide selection of conventional switching devices such as, power FET's, IGPT's, IPET's, conventional bipolar transistors, thyristors or other semiconductor switching devices. Alternatively, for many applications (e.g. rectification or injection into a DC load) simple diodes may be used instead of switches. One advantage of using diodes is that using them simplifies the control circuitry which operates the switches within the circuit.

Again, by operating the PCS module in this way at the higher voltages, we are able to avoid that region of operation where its efficiency begins to suffer due to the relatively high forward voltage drops of the SCR's in the module. In other words, as before we achieve the higher efficiencies associated with high voltage operation. In addition, by relying on the transformer to achieve part of the overall step down ratio that is required, we also avoid multiplying the losses within the PCS module by the full amount of the step-down ratio.

The output section utilizes for the discharge a transfomrer and an inductor in series. These two components define the discharge period and the effective inductance for the resonant discharging mode. The inductor may also be placed in the output of the transformer or its effected value may may be incorporated into the transformer during its design. It follows that the output section can be configured in such a way that this section may be shared by several modules to permit sequential discharging for the various applications and configurations described in an earlier section herein. In fact, the transformer coupled input, the PCS control, and the inversion functions, as well as the transformer coupled output section may be selectively combined into one module. By adding a completely or partially shared output section, multiple such modules may be combined to permit dual or multiple resonant discharge operations as previously described. Such modules may be used beneficially in any of the circuit applications covered herein or described in the earlier patent.

It should be noted that the input voltage to the circuits shown in FIG. 14–17, as with the previously described embodiments, can be either AC or DC. This should be readily apparent from the fact that the circuit is being operated in a pulsed mode which samples the voltage of the waveform many times per second.

Other embodiments are within the following claims. For example, though the sequential discharge technique has been described in the context of rectification, it can also be used to reconstruct AC waveforms of any frequency and/or phase. The triggering sequence that is generated by the control module would, of course, have to be different and would likely be more complicated; however, the principles are the same.

The desired rate of the charging and discharging dictate the values of the L and C components that are used in the circuit. In the described embodiment, the inductors on the input side and the inductors on the output side have been described as having the same value. This, however, need not be the case.

I claim:

1. A method of transferring energy from a power source into an output node, said method comprising:

separately charging each of a plurality of energy storage elements from the power source;

after the plurality of energy storage elements are charged, discharging a selected one of said plurality of energy storage elements through an inductive element into the output node; and as the selected energy storage element is being discharged through the inductive element, when its voltage reaches a preselected value, discharging another one of said plurality of energy storage elements through the inductive element into the output node.

2. The method of claim 1 wherein during the charging step each of the plurality of the energy storage elements is charged to a corresponding voltage, and wherein the method further comprises selecting as the selected energy storage element the one of said plurality of energy storage elements with the largest voltage.

3. The method of claim 1 wherein the output node is at an output voltage and wherein the voltage of the selected energy storage element is at least two times the output voltage.

4. The method of claim 1 wherein a complete cycle of operation includes the above described charging steps followed by the above-described discharging steps, and wherein said method further comprises causing a complete cycle of operation to occur multiple times per second.

5. The method of claim 1 further comprising after the plurality of energy storage elements are charged and before discharging a selected one of said plurality of energy storage elements, inverting the polarity of charge stored in at least some of said plurality of energy storage elements.

6. The method of claim 1 wherein the discharging of said another one of said plurality of energy storage elements through the inductive element into the output node begins before the discharging of the selected energy storage element causes the voltage across the selected energy storage element to reach zero volts.

7. A method of transferring energy from a power source into an output node, said method comprising:

from the power source, charging a first energy storage element to a first voltage;

from the power source, charging a second energy storage element to a second voltage;

after the first and second energy storage elements are charged, discharging a first selected one of said first and second energy storage elements through an inductive element into the output node and as the first selected energy storage element is being discharged through the inductive element, when its reaches a preselected value, discharging a second selected one of said first and second energy storage elements through the inductive element into the output node.

8. The method of claim 7 wherein the first voltage is larger than the second voltage and wherein the first selected one of said first and second energy storage elements is the first energy storage element and the second selected one of said first and second energy storage elements is the second energy storage element.

9. The method of claim 7 wherein the output node is at an output voltage and wherein at least one of said first and second voltages is greater than two times the output voltage.

10. The method of claim 7 wherein a complete cycle of operation includes the steps of first charging and then discharging the first and second energy storage and wherein said method further comprises causing a complete cycle of operation to occur multiple times per second.

11. The method of claim 7 wherein the power source is a multiphase line including a first line and a second line and wherein the step of charging the first energy storage element is performed from the first line and wherein the step of charging the second energy storage element is performed from the second line.

12. The method of claim 7 wherein the discharging of said second selected energy storage elements through the inductive element into the output node begins before the discharging of the first selected energy storage element causes the voltage across the first selected energy storage element to reach zero volts.

13. A sequential discharge circuit for transferring energy from a power source into an output node, said circuit comprising:

a plurality of energy storage elements connected to receive energy from the power source, wherein said plurality of energy storage elements includes a first energy storage element and a second energy storage element;

a shared inductive element connected between the plurality of energy storage elements and the output node;

a plurality of unidirectional switches, each of which when turned on discharges a corresponding different one of said plurality of storage elements through said shared inductive element into the output node, each of said unidirectional switches having a control terminal through which it is turned on, wherein the plurality of unidirectional switches includes a first unidirectional switch connected to the first energy storage element and a second unidirectional switch connected to the second energy storage element; and a control unit connected to the control terminals of the plurality of unidirectional switches and controlling the operation of the plurality of unidirectional switches, wherein the control unit is programmed to perform the steps of:

charging the first energy storage element from the power source;

charging a second energy storage element from the power source;

after the first and second energy storage elements are charged, discharging a selected one of the first and the second energy storage elements through the shared inductive element into the output node; and as the selected energy storage element is being discharged through the inductive element, when its voltage reaches a preselected value, discharging the other one of said first and second energy storage elements through the inductive element into the output node.

14. The sequential discharge circuit of claim 13 further comprising monitoring the voltage across the selected energy storage element to detect when the voltage of the selected energy storage element reaches said preselected value.

15. The sequential discharge circuit of claim 13 wherein the inductive element comprises an inductor.

16. The sequential discharge circuit of claim 13 wherein the control unit is programmed to begin discharging the other one of said first and second energy storage elements through the inductive element into the output node before the discharging of the selected energy storage element causes the voltage across the selected energy storage element to reach zero volts.

17. A sequential discharge circuit for transferring energy from a power source into an output node, said circuit comprising:

a transformer with a primary and a secondary, said secondary coupled to the output node;

a plurality of energy storage elements connected to receive energy from the power source;

a plurality of unidirectional switches, each of which when turned on discharges a corresponding different one of said plurality of storage elements through the primary of said transformer, each of said unidirectional switches having a control terminal through which it is turned on; and transformer, each of said unidirectional switches having a control terminal through which it is turned on; and a control unit connected to the control terminals of the plurality of unidirectional switches and controlling the operation of the plurality of unidirectional switches.

18. The sequential discharge circuit of claim 17 further comprising a shared inductive element connected between the secondary and the output node.

19. The sequential discharge circuit of claim 17 further comprising a shared inductive element connected between the primary and said plurality of unidirectional switches.

20. A power conversion system for extracting energy from a power source and delivering it to an output node, said system comprising:

a transformer having a primary winding and a secondary winding;

a unidirectional switching device coupled between the power source and the primary winding of the transformer;

a plurality of capacitors connected in series;

a charging circuit connected to said plurality of capacitors, said charging circuit charging the plurality of capacitors from the secondary winding of the transformer to a predetermined voltage;

a polarity inverting circuit inverting the polarity of the charge stored in selected capacitors of said plurality of capacitors, said polarity inverting circuit including a plurality of inductor circuits, each of which can be switchably coupled to a corresponding different one of the selected capacitors to form a resonant circuit which aids in inverting the polarity of a stored charge in that capacitor; and a discharging circuit extracting power from the plurality of capacitors at a transformed voltage.

21. The power conversion system of claim 20 wherein said transformer is a step-up transformer.

22. The power conversion system of claim 20 wherein said transformer is an isolation transformer.

23. A power conversion system for extracting energy from a power source and delivering it at a transformed voltage to an output node, said system comprising:

a transformer having a primary winding and a secondary winding, said secondary coupled to the output node;

a plurality of capacitors connected in series;

a charging circuit connected to said plurality of capacitors, said charging circuit charging the plurality of capacitors from the power source to a predetermined voltage;

a polarity inverting circuit inverting the polarity of the charge stored in selected capacitors of said plurality of capacitors, said polarity inverting circuit including a plurality of inductor circuits, each of which can be switchably coupled to a corresponding different one of the selected capacitors to form a resonant circuit which aids in inverting the polarity of a stored charge in that capacitor; and a discharging circuit extracting power from the plurality of capacitors and delivering it to the primary of the transformer.

24. The power conversion system of claim 23 further comprising a unidirectional device coupling the secondary winding to the output node.

25. The power conversion system of claim 23 wherein said transformer is a step-down transformer.

26. The power conversion system of claim 23 wherein said transformer is an isolation transformer.

* * * * *